United States Patent [19]
Nomura

[11] Patent Number: 5,993,614
[45] Date of Patent: Nov. 30, 1999

[54] METHOD OF MANUFACTURING SUBSTRATE WITH THIN FILM, AND MANUFACTURING APPARATUS

[75] Inventor: Fumiyasu Nomura, Otsu, Japan

[73] Assignee: Toray Industries, Inc., Tokyo, Japan

[21] Appl. No.: 08/973,312

[22] PCT Filed: Mar. 27, 1997

[86] PCT No.: PCT/JP97/01054

§ 371 Date: Feb. 2, 1998

§ 102(e) Date: Feb. 2, 1998

[87] PCT Pub. No.: WO97/37051

PCT Pub. Date: Oct. 9, 1997

[30] Foreign Application Priority Data

Apr. 1, 1996 [JP] Japan .................................. 8-078840

[51] Int. Cl.⁶ .................................................. C23C 14/34
[52] U.S. Cl. ............. 204/192.12; 117/84; 118/723 VE; 427/45.1
[58] Field of Search ................ 117/84; 118/723 VE; 204/192.12; 427/248.1, 45.1

[56] References Cited

U.S. PATENT DOCUMENTS

| | | | |
|---|---|---|---|
| 4,859,493 | 8/1989 | Lemelson | 427/45.1 |
| 5,250,660 | 10/1993 | Shuman | 530/334 |
| 5,340,454 | 8/1994 | Schaefer et al. | 204/192.12 |
| 5,474,611 | 12/1995 | Murayama et al. | 118/723 VE |
| 5,707,500 | 1/1998 | Shimamura et al. | 204/298.03 |

FOREIGN PATENT DOCUMENTS

| | | |
|---|---|---|
| 62260059 | 11/1987 | Japan . |
| 644472 | 1/1989 | Japan . |
| 335216 | 2/1991 | Japan . |
| 3193873 | 8/1991 | Japan . |
| 5106034 | 4/1993 | Japan . |
| 5250665 | 9/1993 | Japan . |
| 665724 | 3/1994 | Japan . |
| 7278801 | 10/1995 | Japan . |

*Primary Examiner*—Felisa Hiteshew
*Attorney, Agent, or Firm*—Birch, Stewart, Kolasch & Birch, LLP

[57] ABSTRACT

The present invention provides a method of and apparatus for efficiently and continuously manufacturing large, thin-film-coated substrates (i.e. antireflection filters) via small-scale manufacturing apparatus. The apparatus includes a film-forming chamber, two stockers, each capable of storing substrates in multi-stages, a loading chamber and an unloading chamber. The film forming area is centrally positioned, surrounded upstream and downstream by each stocker with loading and unloading chambers positioned upstream and downstream of the stockers, respectively. The film-forming chamber, the loading and unloading chamber and each stocker have, respectively, independent evacuation systems. The film forming chamber also contains a particle generation source and apparatus for passing a substrates, one after another, from the first stocker, in to the film-forming chamber and out to the second stocker. The method, using apparatus such as described above, includes the steps where, while a group of substrates on which a film to be formed are being subjected to film forming in the film forming chamber, the loading chamber is loaded with the next group of substrates and evacuated, and the substrates onto which a film has been formed are unloaded from the unloading chamber, and is characterized in that the substrates are being subjected to film forming while passing through the film forming area.

51 Claims, 22 Drawing Sheets

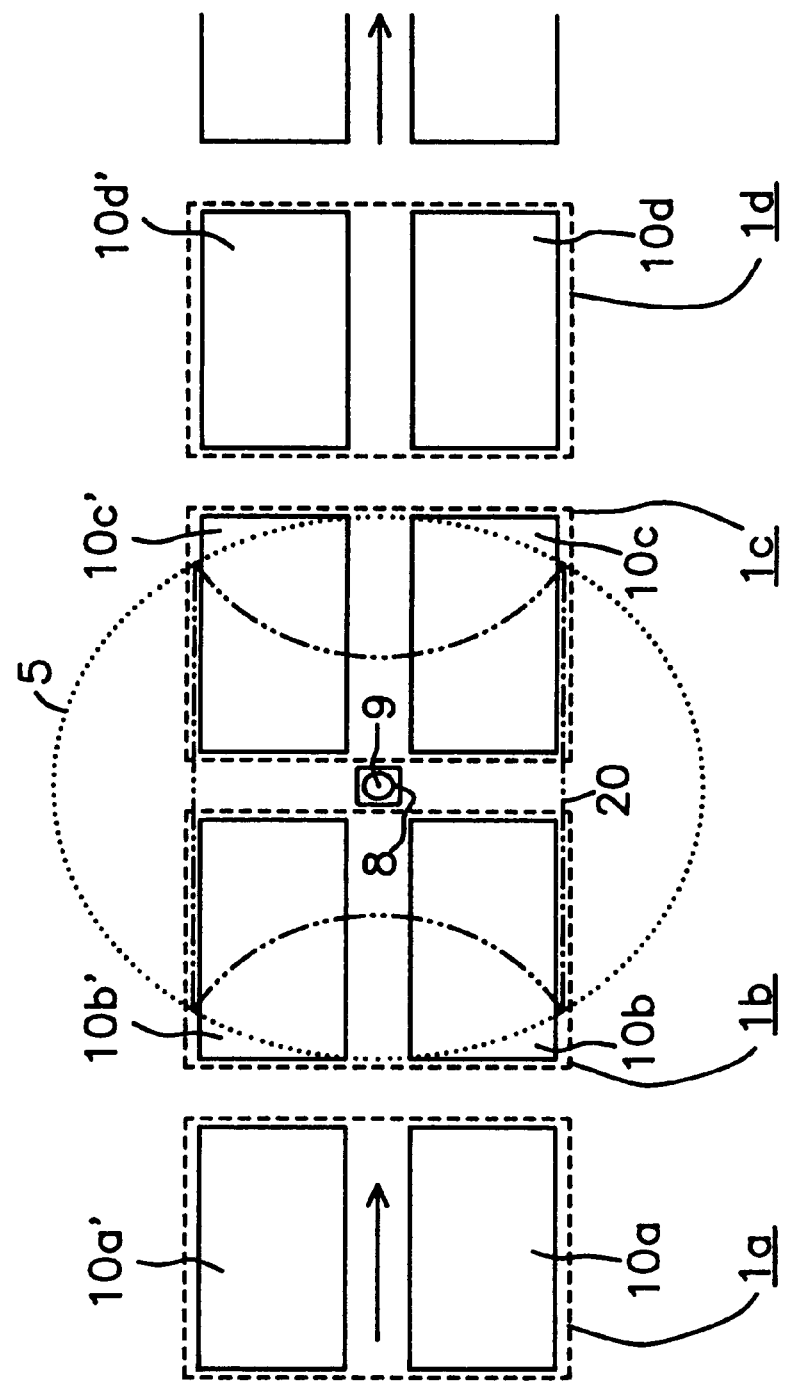

METHOD OF MANUFACTURING SUBSTRATE WITH THIN FILM, AND MANUFACTURING APPARATUS

This application claims the benefit under 35 U.S.C. §371 of prior PCT International Application No. PCT/JP97/01054 which has an International filing date of Mar. 27, 1997 which designated the United States of America, the entire contents of which are hereby incorporated by references.

TECHNICAL FIELD

The present invention relates to a method and apparatus for manufacturing substrate with a thin film used as optical thin films for optical filters such as various band-pass filters, antireflection films of various displays, various thin films used in various semiconductors, optical discs, LCDs and color filters of LCDs, and also recently highlighted MgO films for PDPs, and various transparent electrodes such as ITO, $SnO_2$, $In_2O_3$ and ZnO films used in LCDs, touch panels, EC elements, heating mirrors, etc., for example, antireflection filters, antireflection optical filters to be mounted on the fronts of various displays such as CRTs (cathode ray tubes), LCDs (liquid crystal displays), ELs (electroluminescent displays), LEDs (light emitting diode displays), VFDs (fluorescent character display tubes), projection type displays, etc., antireflection films directly applied onto their display screens, antireflection films applied to polarizing films used in LCDs, interference filters, half mirrors, infrared cold mirrors and IR (infrared) cut filters used popularly for fiber light sources, liquid crystal projectors, motion picture projectors, dental illumination, shopping illumination, etc. respectively sensitive to harmful heat rays (infrared rays), UV (ultraviolet ray) cold mirrors and UV cut filters for exclusively reflecting ultraviolet rays 365, 405 and 436 nm (i ray, g ray and h ray) for the parabolic mirrors, ellipsoidal mirrors and plane mirrors used in semiconductors and liquid crystal displays, and dichroic filters and dichroic mirrors corresponding to R (red), G (green) and B (blue) used in color photographic development, color printers, color faxes, color television cameras and video projectors.

BACKGROUND ART

Films such as optical thin films for optical filters, antireflection films of various displays, and films of various substrate with a thin film used in various semiconductors, optical discs, LCDs, color filters, transparent electrodes, etc. are formed by vacuum evaporation, ion assisted evaporation, ion plating, sputtering, ablation, etc.

In reference to a case where an antireflection film is formed on an optical lens or where an optical thin film such as an antireflection film or optical filter is formed on a flat substrate such as a glass sheet or resin sheet by vacuum evaporation, the conventional method for manufacturing substrate with a thin film is described below in reference to drawings.

FIG. 4 is a typical view showing how such substrate with a thin film are produced. At first, a film forming chamber is described. Inside a vacuum chamber 16, a film material 3 is placed with its film forming particle generating region 2 turned upward in the drawing. An electron beam is emitted from an electron gun 6 to reach the film forming particle generating region 2 due to the effect of a magnetic field not illustrated, to heat the region 2, and as a result, film forming particles 5 are generated. The film forming particle flux axis 9 (directional axis to express the direction in which the film forming particles are generated most intensively) of the film forming particles 5 generated like this is turned upward in the drawing. On or near the axial line of the film forming particle flux axis 9, a film formation monitor 8 is installed, and a film thickness measuring instrument 7 for optically measuring the thickness of the film formed on the film formation monitor 8 is installed further above the monitor 8. To allow the film forming particles to reach the film formation monitor 8, a hole 401 is formed at the center of a domed substrate holder 402. The domed substrate holder 402 can rotate on a horizontal plane above the film forming particle generation source, so that the under surfaces of the substrates on which a film to be formed 403 fixed in the domed substrate holder 402 may be exposed to the film forming particles, to form a film on each of them. Furthermore, to limit the range in which the substrates on which a film to be formed 403 are exposed to the film forming particles 5, a film forming range limiting member 4 is installed at a position between the film forming particle generating region 2 and the substrates on which a film to be formed 403. A shutter 11 or intercepting the film forming particles 5 as required is also similarly installed.

FIG. 5 is a drawing showing this state from the position of the film formation monitor 8 in the direction toward the film forming particle flux axis 9. The substrates on which a film to be formed 403 are arranged, for example as illustrated, to be held by the domed substrate holder by using the available area of the holder to the maximum extent, and the hole 401 is formed on or near the axial line of the film forming particle flux axis 9, to prevent the film forming particles 5 from being intercepted by the substrates, etc. The film formation monitor 8 is arranged to allow the film forming particles to reach the film formation monitor 8 through the hole.

To form a thin film on the under surface of each of the respective substrates on which a film to be formed 403, at first, the domed substrate holder 402 is kept rotating beforehand. Then, the electron beam emitted from the electron gun 6 continuously heats the film forming particle generating region 2 of the film material 3, to generate the film forming particles from there. In this case, at first, since the shutter 11 is closed, the film forming particles cannot reach the substrates on which a film to be formed. When the temperature of the film forming particle generating region 2 reaches a steady state, the film forming particle generation intensity also reaches a steady state. After this has been confirmed, the shutter 11 is opened. The film forming particles generated from the film forming particle generating region 2 are flown radially with the direction of the film forming particle flux axis 9 as the central direction, and reach the respective substrates on which a film to be formed 403. Furthermore, through the hole 401 formed on or near the axial line of the film forming particle flux axis 9, some film forming particles reach the film formation monitor 8.

The thickness of the film formed on each of the respective substrates on which a film to be formed 403 is indirectly measured by measuring the thickness of the film formed on the film formation monitor 8 by the film thickness measuring instrument 7. On the film formation monitor 8, a film is formed under conditions approximating those for forming the film on each of the respective substrates on which a film to be formed 403. So, the thickness of the thin film formed on the monitor has a certain correlation with the thickness of the thin film formed on each of the respective substrates on which a film to be formed 403. Ideally, the thickness of the thin film formed on the monitor is the same as the thickness of the thin film formed on each of the substrates on which a film to be formed 403, since the substrates on which a film to be formed 403 fixed in the domed substrate holder 402 are exposed incessantly to the film forming particles like the film formation monitor 8. Actually, the correlation is strictly obtained by an experiment. From the results, the correlation between the increment per unit time of the thickness of the thin film formed on the film formation monitor 8 and the increment per unit time of the thickness of the thin film formed on each of the substrates on which a film to be formed 403 is obtained.

Based on the measured thickness of the thin film, the film forming process control is carried out, such as adjusting the film forming rate during film formation, the refractive index of the films formed, etc., and closing the shutter to terminate film formation when a desired thickness has been reached.

In most film forming processes adopted especially for optical thin film application, substrates on which a film to be formed are held by a domed substrate holder rotating around a certain axis (may be virtual). Such a technique is described, for example, in Japanese Patent Laid-Open (Kokai) No. 1-306560.

Furthermore recently, also in a continuous production process in which a loading chamber and an unloading chamber are installed and connected with a film forming chamber to achieve higher productivity, a domed substrate holder is similarly used and rotated.

FIG. 6 is a typical view showing such a continuous production process. In this embodiment, a loading chamber 601, a film forming chamber 602 and an unloading chamber 603 are connected. Substrates on which a film to be formed are held by a domed substrate holder 604. One film forming unit consists of only the substrates on which a film to be formed held by the domed substrate holder 604. Each of the chambers can store one film forming unit. In this embodiment, during film formation, the next group of the substrates on which a film to be formed are supplied into the loading chamber, and the loading chamber is then evacuated. Concurrently, the unloading chamber is opened to the open air, and the substrates with a film formed are unloaded. Then, the unloading chamber is evacuated.

This technique is described, for example, in Japanese Patent Laid-Open (Kokai) No. 3-193873, etc. Furthermore a similar sputtering apparatus is described in Japanese Patent Laid-Open (Kokai) No. 7-278801, etc. However, in most of the continuous production apparatuses required to assure high accuracy in film thickness, etc., the substrate holder is fed to a film forming chamber (vacuum treatment chamber) and rotated there, and intermittent continuous operation is made with the time taken for film formation as the tact time. So the area available for film formation is used wastefully. This does not pose any large problem in the case of various optical lenses and small substrates. The reason is described below in reference to drawings.

FIG. 7 is a diagram showing the relation between the film forming area and the moving area of substrates on which a film to be formed. The film forming area 701 is usually almost circular. In the conventional method, a domed substrate holder as large as the circular film forming area 701 is prepared to hold substrates. That is, the film forming area in this case is inside the circular area 701. However, if the substrates on which a film to be formed are fed from left to right in the diagram, while having a film formed on each of them, the shaded portions of FIG. 7 can also be used as the film forming area. In the conventional method, only $\pi/4$ (78.5%) of the area available for film formation is used for production.

Furthermore, when the domed substrate holder is used, the problem becomes serious if the size of the substrates on which a film to be formed is larger. For example, in FIG. 8, an apparatus which has a circular film forming area with a diameter of 1 m is used to form a film on each of surface antireflection optical filters (26 cm×33 cm) for displays with a diagonal line length of 14 inches (35 cm). This state is seen from the position of the film formation monitor 8 in the direction toward the film forming particle flux axis 9. In this case, even if the conventional circular substrate holder is used most effectively, only five optical filters can be held. That is, in an area of 0.785 m$^2$ available for film formation, only an area of 0.26×0.33×5=0.429 m$^2$ is used for film formation. Only about 55% of the area available for film formation can be used for manufacturing such filters. If it is intended to raise the productivity of such filters, the manufacturing apparatus used must be larger than necessary.

Furthermore, there is a problem that if larger substrates are to be processed, the substrate loading efficiency declines. In addition, if the conventional method is used for forming a film on each of larger substrates, the apparatus used must be larger than necessary, and as a result, the evacuation system must also be larger as a further other problem.

Therefore, it can be said that production has been made using an apparatus remarkably low in productivity. The reasons why the method as shown in FIG. 4 has been used even though the productivity may decline remarkably like this are considered to be as follows.

The first reason can be that the properties of the films formed by the film forming particles flying in the direction of and around the film forming particle flux axis are more excellent than those of the films formed by the film forming particles flying in any other direction apart from said direction, and that the method has been believed to be most suitable for monitoring the film forming process. The reason for the excellent properties is that since the film forming particles flying in the direction of and around the film forming particle flux axis are large in number and generally have high kinetic energy, the films formed are high in refractive index and homogeneous. On the contrary, the film forming particles flying in any other direction away from the film forming particle flux axis are small in number and low in energy, and the films formed are small in refractive index and thin.

Therefore, it has been considered as a matter of course to place the film formation monitor near the film forming particle flux axis, and furthermore, in a design to rotate the substrates on which a film to be formed, it is most convenient to place the film formation monitor at the center of the substrate holder.

As the second reason, it has been believed to be a basic technique to rotate the substrate holder many times at an above position to form one-layer films to eliminate the unevenness otherwise caused by the conventional unstable film forming particle generation source. As a means for exposing the substrates on which a film to be formed to the film forming particles many times, the use of a rotary system has been mechanically simple.

A conventional apparatus which has overcome the low productivity of the intermittent continuous apparatus with a rotaty transfer type substrate holder is called a feed through type continuous apparatus or in-line apparatus. A feed through type film forming apparatus based on sputtering is proposed, for example, in Japanese Patent Laid-Open (Kokai) No. 5-106034, and a similar vacuum evaporator is proposed, for example, in Japanese Patent Laid-Open (Kokai) No. 6-65724. In these cases, the substrate holder (substrates) is once placed in a loading chamber called a load lock chamber, to stand by, and is fed into the film forming chamber intermittently continuously without releasing the vacuum of the film forming chamber. In these apparatuses, the time during which the substrates on which a film to be formed are exposed to vacuum as well as heat until a film is formed on each of them is very short (say, 10 minutes at the longest), and this poses a problem in the case of film formation on resin substrates, etc. In the case of resin substrates, it is often practiced to expose the substrates to heat or vacuum for a longer period of time, for degassing the substrates. If the degassing is not sufficient, such problems often occur that the adhesion between the resin substrate and the vapor-deposited film as adopted in the present invention is insufficient and that the gas evolved from the substrate during film forming process affects the film processing conditions, not allowing a desired film to be obtained. Furthermore, it can happen that when a transparent film for any of said applications is handled, visible light is absorbed, or that in the case of an optical film, the refractive index of the film is changed not to allow the desired spectral characteristics to be obtained. To solve these problems, in some cases, a vacuum chamber is arranged additionally on the loading side of the loading chamber, but it makes the apparatus very large (long in the direction in which the substrates on which a film to be formed are fed) disadvantageously in view of space.

When a multi-layer film such as a two-layer film is formed, for example as proposed in Japanese Patent Laid-Open (Kokai) No. 7-278801, a plurality of treatment chambers are provided, and a substrate holder is fed after lapse of a tact time to a treatment chamber, rotated there to have a film layer formed on it, and fed to the next treatment chamber after lapse of another tact time. In this case, vacuum treatment chambers as many as the kinds or number of film layers to be formed are used to make the apparatus large-sized disadvantageously. Furthermore, in the case of Japanese Patent Laid-Open (Kokai) No. 3-193873, etc., an idea of exchanging film forming particle generating materials is taken into account, but in this apparatus constitution, it is difficult to use large-sized substrates on which a film to be formed efficiently.

Moreover, as a feed through type continuous apparatus, it is proposed to arrange film forming particle sources in series, to obtain a multi-layer film by one time of feeding for film formation. However, in the case of a multi-layer film, especially in the case of an optical multi-layer film or a multi-layer film for an optical disc, etc., the film forming process conditions of one layer are often different from those of the previous layer or the subsequent layer, and it is very difficult to control the process conditions for obtaining a desired film. To solve this problem, for example, in Japanese Patent Laid-Open (Kokai) No. 62-260059, an orifice structure is used between the respectively adjacent vacuum treatment chambers, and it can be seen how difficult it is to separate the process conditions of different layers.

An apparatus in which the loading chamber contains in multi-stages substrates on which a film to be formed is proposed, for example, in Japanese Patent Laid-Open (Kokai) Nos. 64-4472 and 3-35216, etc., but since the film forming chamber does not have a structure to allow the substrates to be contained in multi-stages, that is, since the film forming chamber is separated from the loading chamber and the unloading chamber, continuous production cannot be effected. In the case of Japanese Patent Laid-Open (Kokai) No. 64-4472, since a mechanism to allow the target material to be exchanged is adopted for forming a multi-layer film, a multi-layer film can be formed, but since the loading chamber and the unloading chamber must be kept at atmospheric pressure to load and unload substrates on which a film to be formed and must be kept to stand by until they reach a vacuum condition equivalent to that of the film forming chamber, continuous production cannot be effected. In the case of Japanese Patent Laid-Open (Kokai) No. 3-35216, though the apparatus is intended to form a single-layer film, respectively two loading chambers and unloading chambers are used to allow continuous production. However, in this case, since the direction in which the substrates on which a film to be formed are loaded, the direction in which they are unloaded, and the direction in which they are fed for film formation are arranged three-dimensionally in three axes, a machine trouble is likely to occur when the substrates on which a film to be formed are changed in direction, and it is difficult to install the means for transferring the substrates in three directions in the apparatus. That is, it is very difficult to keep the transfer means sealed in vacuum, and the apparatus cannot be said to be suitable for practical production.

OBJECT OF THE INVENTION

The object of the present invention is to provide a method and apparatus for continuously manufacturing substrate with a thin film, which allow substrates to be smoothly fed by a small apparatus even in the case of multi-layer films, are good in productivity, and allow many kinds (many sizes) of films to be produced by one apparatus, without using large-sized-scale apparatus or causing decline of productivity even if the substrates to have a thin film formed on each of them are large-sized or fed continuously.

DISCLOSURE OF THE INVENTION

The present invention to achieve the above object is: A method for manufacturing substrate with a thin film, in which a film forming chamber with first and second stockers capable of storing in multi-stages substrates on which a film to be formed upstream and downstream of a film forming area is provided, and a loading chamber and an unloading chamber are provided upstream and downstream of the film forming chamber, respectively with a stocker capable of storing in multi-stages the substrates on which a film to be formed, wherein while a group of substrates on which a film to be formed are being subjected to film forming in the film forming chamber, the loading chamber is loaded with the next group of substrates on which a film to be formed and evacuated, and the substrates which have been previously subjected to film forming are unloaded from the unloading chamber, comprising the substrates are being subjected to film forming while passing through the film forming area.

As a preferable embodiment, for example, the substrates on which a film to be formed are taken out of the first stocker one after another, are passed through the film forming area one after another and are put into the second stocker, and they are taken out of the second stocker one after another, are passed through the film forming area one after another and are put into the first stocker one after another, thus being moved in the sealed chamber repetitively, to be subjected to film forming.

As a more preferable embodiment, the speed of passage is substantially constant, to allow the manufacturing of substrates with a homogeneous film formed on each of them.

The apparatus for executing the method for manufacturing substrate with a thin film is:

An apparatus, comprising a film forming chamber with first and second stockers capable of storing substrates on which a film to be formed in a plurality of stages upstream and downstream of a film forming area, and a loading chamber and an unloading chamber provided upstream and downstream of said film forming chamber, respectively with a stocker capable of storing in multi-stages substrates on which a film to be formed, wherein said film forming chamber, said loading chamber and said unloading chamber have respectively an independent evacuation means to allow evacuation; and said film forming chamber has a film forming particle generation source, a means for feeding the substrates on which a film to be formed through the film forming area, and means for relocating the substrates on which a film to be formed one after another from the first stocker into the feeding means and further relocating from the feeding means into the second stocker.

BRIEF DESCRIPTION OF THE DRAWINGS

FIG. 9 A drawing showing the position of a film formation monitor in a conventional method for manufacturing substrate with a thin film.

MEANINGS OF SYMBOLS

Figure 1:
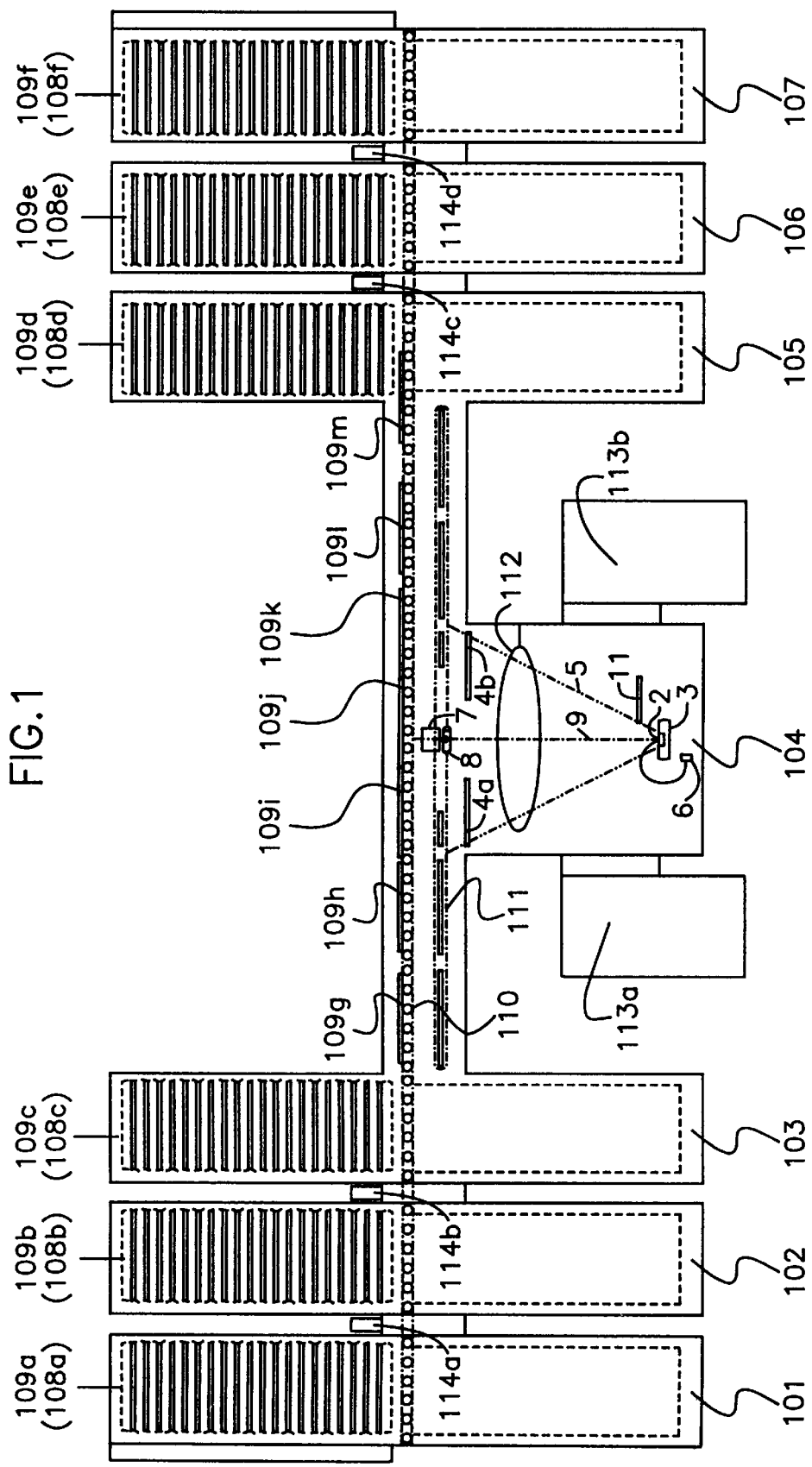
FIG. 1 A side view showing one example of the method for manufacturing substrate with a thin film of the present invention.

1a–d: substrate on which a film to be formed
2: film forming particle generating region 3: film material
4a, b: film forming area limiting member
5: film forming particle 6: electron gun
7: film thickness measuring instrument
8: film formation monitor 9: film forming particle flux axis
10a–d': substrate on which a film to be formed
11: shutter 16: vacuum chamber 20: film forming area
101, 102: loading chamber 103: stocker chamber
104: film forming chamber 105: stocker chamber
106, 107: unloading chamber 108: substrate holder
108a–f: a group of substrate holders
109a–m: a group of substrates on which a film to be formed
110: feeding means 111: substrate heating means
112: antenna for high frequency plasma generation
113a–h: vacuum pump 114a–d: gate valve
211a–b: ion gun 212a–d: oil-sealed rotary pump
218a–b: film formation monitor
310a–d: substrate on which a film to be formed
310b: substrate on which a film to be formed
310c: substrate on which a film to be formed 310d: substrate on which a film to be formed
401: hole 402: domed substrate holder
403a–g: substrate on which a film to be formed
404: vacuum pump 601: loading chamber
602: film forming chamber 603: unloading chamber
604a–d: substrate holder 604c: substrate holder
605a–c: a group of substrates on which a film to be formed
606a–d: gate valve 701: circular film forming area
800: circular substrate holder
801–805: substrate on which a film to be formed
1000: substrate holder
1101–1103: substrate on which a film to be formed
1200: substrate holder
1201–1202: substrate on which a film to be formed
1300: circular substrate holder
1301–1308: substrate on which a film to be formed
1400: circular substrate holder
1401–1405: substrate on which a film to be formed
1500: circular substrate holder
1501–1503: substrate on which a film to be formed

MOST PREFERRED EMBODIMENTS OF THE INVENTION

Embodiments of the method for manufacturing substrate with a thin film of the present invention are described below in reference to drawings.

The substrates on which a film to be formed preferably used in the present invention can be glass sheets, plastic plates, plastic sheets, plastic films, etc. The plastic materials in this case include polymethacrylic acid based resins, polyolefin based resins, polyether based resins, polycarbonate based resins, polyester based resins, polysulfone based resins, polyamide based resins, polysulfide based resins, unsaturated polyester based resins, epoxy based resins, melamine based resins, phenol based resins, diallyl phthalate based resins, polyimide based resins, maleimide based resins, polyphosphazene based resins, urethane based resins, polyvinyl acetate based resins, polyvinyl alcohol based resins, styrene based resins, vinyl chloride based resins, cellulose based resins, diethylene glycol bisallyl carbonate polymer (CR-39), etc. When these substrates on which a film to be formed with a film formed on each of them are used as optical filters or antireflection films of displays, it is preferable that the substrates on which a film to be formed are transparent or translucent. Recently, to improve the contrast of the display screen or for easier observation of the screen, it is preferable to use substrates with a transmittance of about 30 to 70% or with a color selective transmittance. A color grayish to an extent not to impair the colors of the display screen is more preferable.

At first, a case of using a fixed film formation monitor is described below.

If the substrates on which a film to be formed are larger, the present invention is more effective. The present invention is suitable for substrates on which a film to be formed with a short side length of 1/5 or more of the width of the film forming area or 20 cm or more, more suitable for those with a short side length of 26 cm or more.

Furthermore, as shown in FIG. 9, the substrates on which a film to be formed can be arranged in a plurality of rows in the feeding direction, to be exposed to film forming particles simultaneously for having a film formed on each of them. The substrates on which a film to be formed can also be arranged along a curve like a circle, in addition to being arranged like a straight line. For example, the substrates on which a film to be formed can be arranged along a circle and rotated along the circle during film formation, so that the same substrates may pass through the film forming area repetitively.

The film forming area refers to the area which is exposed to the film forming particles of an amount enough to form thin films on substantially the same plane as the film forming surfaces of substrates on which a film to be formed. When the substrates on which a film to be formed are arranged in a plurality of rows, the film forming area means the total area including the respective regions of the substrates, the gaps between them and the region surrounding them (film forming area 20 in FIG. 9).

The position where the film formation monitor is fixed in the present invention can be outside the film forming area (that is, for example, the back side of the film forming area limiting member). If this condition is satisfied, the thickness of the film formed on the monitor can be correlated with the film formed on each of the substrates on which a film to be formed without restricting the arrangement of the substrates to be subjected to film forming. In addition, since there is no intervening thing between the film forming particle generation source and the film formation monitor, a thin film equivalent to the thin film formed on each of the substrates on which a film to be formed can be formed on the monitor, and the film forming process can be controlled accurately. The film formation monitor can of course be provided inside the film forming area and outside the substrates on which a film to be formed.

FIG. 1 shows an embodiment of the method and apparatus for manufacturing substrate with a thin film of the present invention. In this embodiment, a loading chamber 102, a first stocker chamber 103, a film forming chamber 104, a second stocker chamber 105 and an unloading chamber 106 are arranged to be connected. The first stocker chamber 103 and the second stocker chamber 105 are not partitioned from the film forming chamber by a gate valve, etc., but are located in the same sealed vacuum housing. So, the first stocker chamber 103 and the second stocker chamber 105 can be considered to be contained in the film forming chamber 104. Substrates on which a film to be formed 109 are held by substrate holders 108. One film forming unit consists, for example, of twenty substrate holders 108, and each chamber can store one film forming unit.

An example of the film forming process is described below with attention paid to the feeding of the substrates on which a film to be formed. The respective steps of the process are described below starting from step A.

Step A: With a first group of substrate holders 108 loaded and positioned in the loading chamber 102, the loading chamber 102, the film forming chamber 104 and the unloading chamber 106 are evacuated,.

Step B: The first group of substrate holders 108 in the loading chamber 102 are relocated one after another into the first stocker chamber 103, with the loading chamber 102 shielded from the open air.

Step C: With the loading chamber 102, the film forming chamber 104 and the unloading chamber 106 shielded from each other, the loading chamber 102 is opened to the open air. Then, a second group of substrate holders are loaded into the loading chamber 102, and the loading chamber 102 is evacuated, while the first group of substrate holders 108 are taken out of the first stocker 103 in the film forming chamber 104 one by one to be mounted onto feeding means 110. Then, for example, twenty substrates on which a film to be formed 109 are fed through the film forming area exposed to film forming particles 5. Subsequently all the twenty substrate holders 108 are relocated from the feeding means 110 into the second stocker chamber 105.

Step D: With the loading chamber 102 and the unloading chamber shielded from the open air, the first group of substrate holders 108 are relocated from the second stocker chamber 105 into the unloading chamber 106 one after another, while the second group of substrate holders 108 are relocated from the loading chamber 102 into the first stocker chamber 103 one after another.

Step E: With the loading chamber 102, the film forming chamber 104 and the unloading chamber 106 shielded from each other, the unloading chamber 106 is opened to the open air, and the first group of substrate holders 108 are unloaded. Then, while the unloading chamber 106 is evacuated, the loading chamber 102 is opened to the open air, and a third group of substrate holders 108 are loaded into the loading chamber 102. Then, the loading chamber 102 is evacuated, while the second group of substrate holders 108 are taken out of the first stocker chamber 103 one by one in the film forming chamber 104, to be mounted on the feeding means 110, and are fed through the film forming area one after another, to form a film on each of, for example, twenty substrates on which a film to be formed 109. Then, all the twenty substrate holders 108 are relocated from the feeding means 110 into the second stocker chamber 105.

Step F: With the loading chamber 102 and the unloading chamber shielded from the open air, the second group of substrate holders 108 are relocated from the second stocker chamber 105 into the unloading chamber 106 one after another, while the third group of substrate holders 108 are relocated from the loading chamber 102 into the first stocker chamber 103 one after another.

Step G: With the loading chamber, the film forming chamber 104 and the unloading chamber 106 shielded from each other, the unloading chamber 106 is opened to the open air, and the second group of substrate holders 108 are unloaded. Then, while the unloading chamber 106 is evacuated, the loading chamber 102 is opened to the open air, and a fourth group of substrate holders 108 are loaded into the loading chamber 102. Then, the loading chamber is evacuated, while the third group of substrate holders 108 are taken out of the first stocker chamber 103 one by one in the film forming chamber 104, to be mounted on the feeding means 110, and, for example, twenty substrates on which a film to be formed 109 are exposed to the film forming particles 5, to be subjected to film forming. Then, all the twenty substrate holders 108 are relocated from the feeding means 110 into the second stocker chamber 105.

Step H: Steps F and G are repeated n times (n is an optional number of times).

The film forming process in the present invention can also contain the following treatment. For example, film formation and treatment can be carried out alternately. The treatment in this case can be the treatment of substrates by oxygen plasma, any of various gas plasmas, irradiation with oxygen ions or argon ions, etc. by an ion gun. This treatment is used, for example, for the purpose of improving the adhesive strength between a substrate on which a film to be formed and a film forming material, or between a film forming material and another film forming material, etc.

In the film forming process, for example, the film forming particle generating region 2 of the film forming material 3 is continuously heated by the electron beam generated from an electron gun 6, to generate film forming particles there. In this case, at first, a shutter 11 is closed, and the film forming particles cannot reach the substrates on which a film to be formed. If the temperature of the film forming particle generating region 2 reaches a steady state, the film forming particle generation intensity also reaches a steady state. After it has been confirmed, the shutter 11 is opened. After stable film formation has been confirmed on the film formation monitor, the substrate holders 108 are fed from left to right in FIG. 1 at a certain speed. In this case, it is preferable that the speed of passage can be changed based on the information of the film formation monitor. The film forming particles generated from the film forming particle generating region 2 fly radially with the direction of a film forming particle bundle axis 9 as the central direction, to reach the respective substrates on which a film to be formed 109.

It should be ensured that the thickness of the film formed on the film formation monitor has a certain correlation with the thickness of the film formed on each of the substrates on which a film to be formed. Ideally when films have been formed on, for example, twenty groups of substrates on which a film to be formed 109, the thickness of the film formed on the film formation monitor 8 is about 20 times the thickness of the film formed on each of the substrates on which a film to be formed 109. Actually, this correlation is obtained strictly by an experiment. From the results, the correlation between the increment of the thickness of the film formed on the film formation monitor 8 per unit time and the increment of the thickness of the film formed on each of the substrates on which a film to be formed 109 per unit time is obtained.

Based on the results of film thickness measurement, the film forming rate during film formation, the refractive index of the film formed, etc. are adjusted. After it has been confirmed that, for example, the last 20th one of the substrate holders 108 corresponding to, for example, the last 20th one of the substrates on which a film to be formed 109 has passed the film forming area, the shutter 11 is closed, to complete film formation in the control of the film forming process.

For forming a multi-layer film, the substrate holders 108 are relocated from the first stocker chamber 103 to the feeding means 110 one after another, to be mounted on the feeding means 110, for being fed, and, for example, twenty substrates on which a film to be formed 109 are exposed to the film forming particles 5, to be subjected to film forming. Then, all the twenty substrate holders 109 are relocated from the feeding means 110 into the second stocker chamber 105, and subsequently, the material of the film forming particle generation source is changed. Now, the substrate holders 108 are relocated from the second stocker chamber 105 onto the feeding means 110 one after another in the reverse direction, to be mounted on the feeding means 110, for being fed, and the twenty substrates on which a film to be formed 109 are exposed to the film forming particles 5. Then, all the twenty substrate holders 108 are relocated from the feeding means 110 into the first stocker chamber 103. This is repeated. If the number of transfer times is even, the substrate holders 108 mounted on the feeding means 110 are not exposed to the film forming particles when fed from left to right in the drawing after the final layer of the film has been formed. Thus, a process as described above can be achieved.

Figure 3:
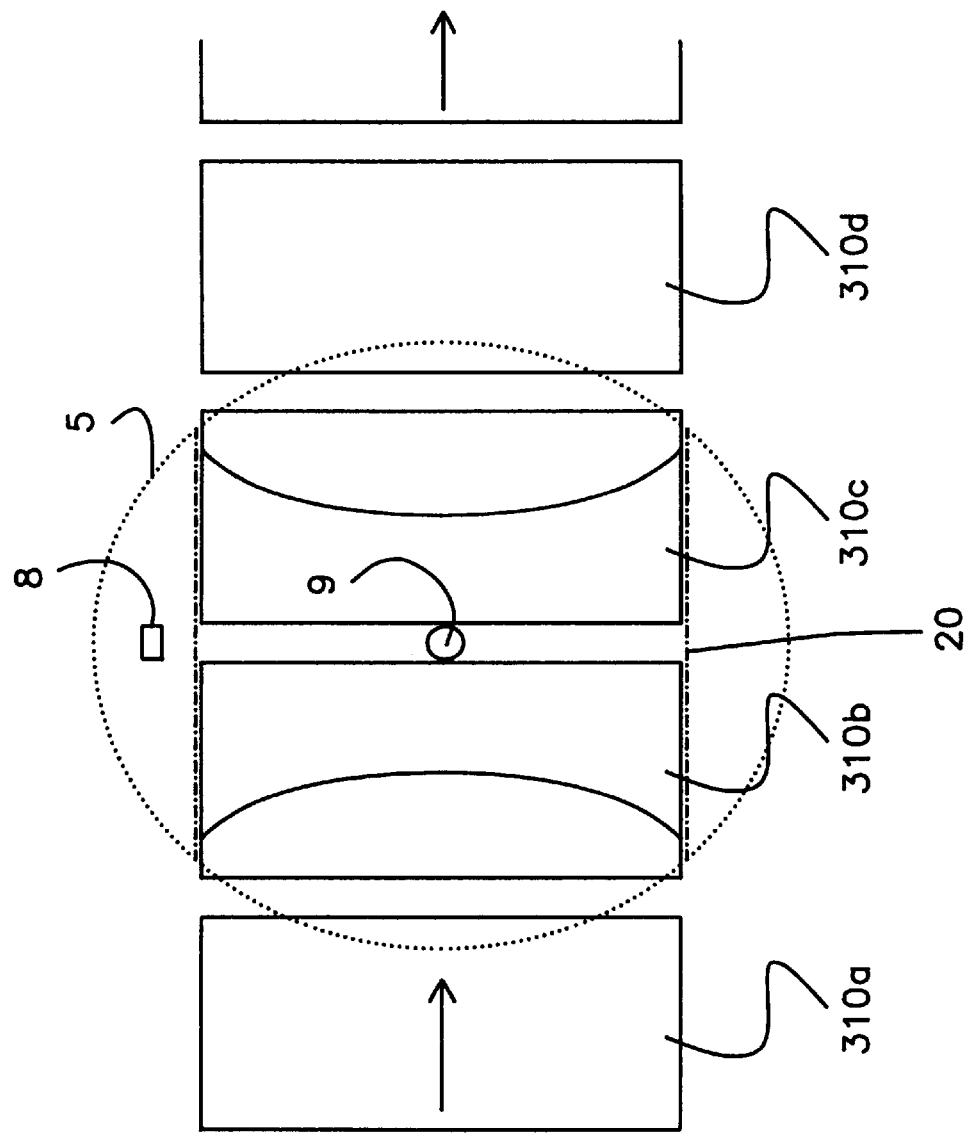
FIG. 3 A drawing showing the position of a film formation monitor in one example of the method for manufacturing substrate with a thin film of the present invention.

FIG. 3 expresses the position at which the film formation monitor is fixed. The film formation monitor 8 is the same as in the conventional method for manufacturing substrate with a thin film shown in FIG. 9, except that the film formation monitor 8 is arranged outside the film forming area to measure the thickness of the film formed on the film formation monitor. The film formation monitor 8 is located at a position outside the substrate region 20 in the direction perpendicular to both the progression direction of the substrates on which a film to be formed 310 and the film forming particle flux axis 9. Since the film formation monitor 8 is located at this position, a film can be obtained on each of the substrates on which a film to be formed 310, with a size more than double that in FIG. 9. If the film formation monitor is provided outside the rows of the substrates on which a film to be formed as in this embodiment, the distance between the film formation monitor and the film forming particle generation source can be preferably made closer to the distances between the substrates on which a film to be formed and the film forming particle generation source.

This arrangement is also preferable since the film forming conditions for the film formed on the film formation monitor can be made closer to the film forming conditions for the film formed each of the substrates on which a film to be formed. Though depending on the intended properties of the film, it is preferable to obtain a film on the film formation monitor which is closer to the films in the substrate region in physical properties such as refractive index, density and electric properties and also in film thickness.

For making the film forming conditions of the film formed on the film formation monitor close to those for the film formed on each of the substrates on which a film to be formed as described above, it is more preferable that the position of the monitor is as described in WO 95/33081.

Based on the results of film thickness measurement, the film forming process is controlled to adjust such properties as the film forming rate and the refractive index of the films formed during film formation, and to close the shutter 11 when the desired film thickness is achieved.

Figure 2:
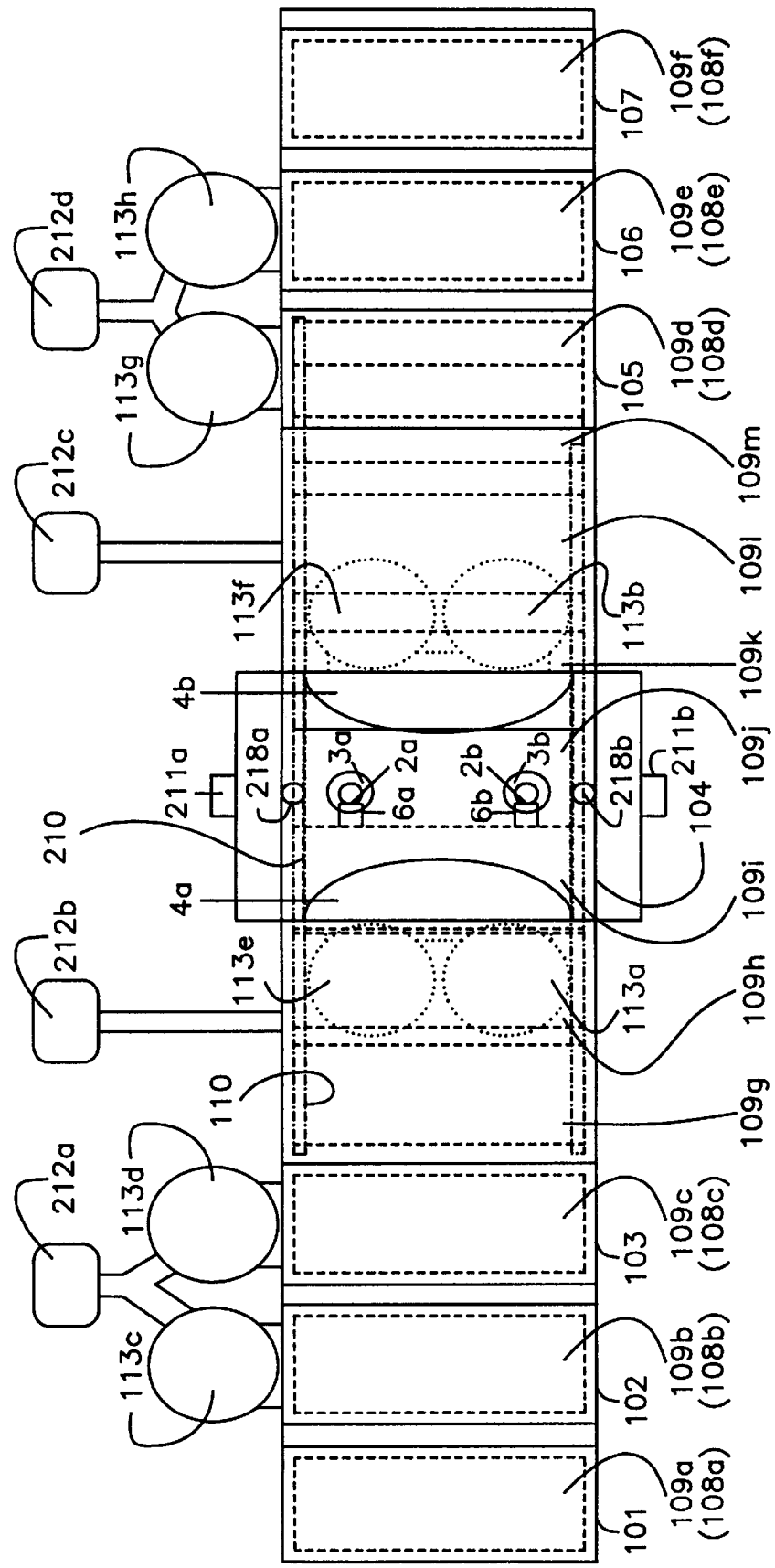
FIG. 2 A top view of FIG. 1.

Furthermore, in the present invention, the film forming area limiting member is located between the film forming particle generation source and the substrates on which a film to be formed, and has a function to limit the film forming particle flying range. For example, something like a film forming area limiting member 4 shown in FIG. 1 (a plate for limiting the size and form of the film forming area in the substrate progression direction; the film forming area 20 of FIG. 2 is formed like a spool, since the film forming area is limited by a half-moon shaped film forming area limiting member) is used. The film forming conditions on the film forming particle source side of the film forming area limiting member are equivalent to those in the film forming area. So, it is preferable that the film formation monitor is located at this position for measuring the thickness of the film formed on the film formation monitor, since it is easy to correlate the film thickness with the thickness of the film formed on each of the substrates on which a film to be formed. Furthermore, the film forming area limiting member can also be provided as the film formation monitor to measure the thickness of the film formed there.

A case where the film formation monitor can be moved is described in WO 95/33081, and it can also be used in the present invention.

In the present invention, that a film is formed on each of the substrates on which a film to be formed while the substrates are fed through the film forming area means that the substrates on which a film to be formed are not stopped till their feeding through the film forming area is completed. If they are stopped while they are being fed, they are exposed to film forming particles during different periods of time in the feeding direction, making it difficult to obtain homogeneous films. However, bit-by-bit intermittent movement or a stop for a time short enough not to make partial differences in feeding time is allowed. That is, any stop of any duration not to cause any substantial variation in the duration of exposure to the film forming particles in the progression direction is not contrary to the definition that the film is formed on each of the substrates while the substrates are fed through the film forming area. The partial difference of feeding time should be 20% or less, though depending on other conditions. A difference of 10% or less is preferable, and 5% or less is more preferable. A constant speed is preferable, but if the feeding rate is automatically controlled based on the thickness of the film formed on the film formation monitor, a small speed variation is caused inevitably.

The thin films formed in the present invention can be of any films, but optical thin films for controlling the reflection or transmittance of light, hard coatings for improving the hardness of the surfaces of plastic substrates, etc., insulation films, conductive films, etc. are preferable. Among them, optical thin films required to be accurately controlled in thickness are films for which the present invention can be suitably applied. Especially antireflection films of various displays are films for which the present invention can be suitably applied, since they mostly use large-sized substrates and are multi-layer films. Especially in recently highlighted PDPs which allow thin large-sized display screens with diagonal line lengths of 28 inches to 60 inches to be relatively easily realized, the films of the present invention can be installed on the fronts. The present invention can also attract attention as a method to realize antireflection optical filters intended for improving the contrast, preventing the reflection of external light, cutting infrared rays or cutting electromagnetic waves, etc., and also as a method for forming MgO films at a high speed matched with other steps of production in tact time though it is difficult to form such films by sputtering.

As preferable methods for measuring the thickness of the film formed on the film formation monitor in the present invention, the thickness of the film formed on the film formation monitor placed inside the film forming particle flux can be measured by the light interference method or energy absorption method, or the change of the monitor in mechanical resonance frequency can be measured, or if the film is electrically conductive, its electric resistance can be measured. If the film is an optical thin film, the light interference method is preferable in view of accuracy of measurement.

For measuring the film thickness by the light interference method, the monitor is irradiated, for example, with light with a specific wavelength, and the reflection intensity or transmission intensity of the light is measured. This uses the phenomena that the light interference depends on the refractive index and thickness of the film and that the light reflectance or transmittance changes periodically during film formation. For example, the maximum and minimum reflected light intensities are identified to measure the film thickness. In this case, the measured result reflects not only the film thickness but also the influence of the refractive index, but this is rather preferable in the case of an optical thin film, since it is often intended to achieve a specific value as the optical path length inside the film, rather than the film thickness itself.

When the light interference method is used, it is preferable to control the film forming process by using he phenomenon that the interference light intensity changes periodically in relation with the film thickness. That is, since the interference light intensity has an external value when the optical path length in the film (it is proportional to the product of the film thickness and the refractive index) is integer times of the ¼ of the wavelength λ of the measuring light, stopping the film formation when the condition is satisfied assures that the optical path length in the film becomes integer times of the ¼ of the measuring light. Therefore, it allows the film thickness to be measured at higher reproducibility rather than by controlling in reference to the absolute value of the intensity of interfering light.

It is also preferable to control the process conditions by calculating the temporal change of reflected light intensity and treating it as the temporal change of optical film thickness (refractive index of film x physical film thickness), i.e., the film deposition rate.

When the film is more than several micrometers in thickness or low in light transmittance, it is preferable to measure the thickness by measuring the change of the mechanical resonance frequency of a crystal oscillator.

In the case of such techniques as reactive ion plating and sputtering, it is often preferable to use the energy absorption method using a plasma.

Film forming processes preferably used in the present invention for generating film forming particles include vacuum evaporation, ion assisted evaporation, ion plating, sputtering and ablation.

In vacuum evaporation, for example, a film material is heated in vacuum to be evaporated or sublimed and the vapor is transported onto substrates on which a film to be formed relatively low in temperature, to be condensed and precipitated, for forming a film on each of them. For heating the film material, for example, the film material is irradiated on the surface with a charged corpuscular beam such as an electron beam.

In ion assisted evaporation, gas ions of oxygen or argon, etc. excited by using an ion gun are acceleratedly applied to substrates on which a film to be formed for vapor deposition.

Ion plating is vacuum evaporation executed for potential-biased substrates on which a film to be formed in a plasma of glow discharge, etc. In this case, an electrode is placed for the substrates on which a film to be formed on the side opposite to the film forming particle generation source, to attract particles ionized in a plasma. Sputtering is to irradiate the surface of a film material with a high energy corpuscular beam of ions, molecules or atoms, etc. in a vacuum atmosphere, to directly give the energy to the film forming particles (atoms, molecules or their cluster) of the film material, releasing them into the vacuum atmosphere without heating. Ablation is to supply similar energy using light.

These techniques are means for flying film material particles in vacuum, and generate film forming particles widening radially with a specific direction (for example, the direction normal to the surface of the film forming particle generation source, etc.) as the central direction from a film forming particle source. The axis of the direction which is the central direction of flying film forming particles is called the film forming particle flux axis. In general, in the direction along the film forming particle flux axis, the largest number of film forming particles fly, and as the angle from the axis becomes larger, the number of film forming particles becomes less, and at the same time, the kinetic energy of the film forming particles tends to be smaller.

The kinetic energy of film forming particles mostly affects properties such as the refractive index of the film formed on each of the substrates on which a film to be formed. In general, if the kinetic energy of the film forming particles is higher, the film formed is higher in refractive index and more homogeneous. Furthermore, when the direction of flying film forming particles is closer to the direction normal to the film forming direction on the substrate on which a film to be formed, i.e., to the substrate surface, the refractive index of the film formed is higher. Therefore, the film portion formed in the central portion (near the film forming particle flux axis) of the film forming area has a high refractive index and the film portion nearer to the periphery of the film forming area has a lower refractive index. At the same time, since the number of film forming particles becomes smaller as described above, the film thickness becomes also smaller.

The present invention includes the following methods for controlling the film forming process:

(1) To control by adjusting the length of the substrate on which a film to be formed in the progression direction in a range where the substrate on which a film to be formed or a group of substrates on which a film to be formed is/are exposed to film forming particles.

(2) To control by adjusting the time during which a substrate on which a film to be formed or a group of substrates on which a film to be formed is/are fed through the range where it/they is/are exposed to film forming particles.

(3) To control by adjusting the amount of film forming particles reaching the range where a film forming receiving substrate or a group of substrates on which a film to be formed is/are exposed to film forming particles, per unit time.

(4) To control by adjusting the surface temperature of a substrate on which a film to be formed or a group of substrates on which a film to be formed.

At first, the control of film forming process by using the method (1) is described below. The thickness of a film formed on a substrate on which a film to be formed is basically proportional to the product of the number of film forming particles per unit time reaching the surface of the substrate and the time during which the surface stays in the film forming area. Therefore, by adjusting the size of the substrate in the film forming area in progression direction, the thickness of the film formed on the substrate on which a film to be formed can be controlled.

One problem is that since the film is formed while the substrate on which a film to be formed is fed through the film forming area, all the surface of the substrate on which a film to be formed crosses the film forming particle flux, to have a film formed on it. As described above, within the film forming particle flux, the region close to the film forming particle flux axis is different from the periphery in the number of film forming particles, etc. Therefore, in one substrate on which a film to be formed, the region which passes at and near the film forming particle flux axis and the region which passes the periphery only are different in thickness and physical properties even if they are exposed to the film forming area for the same period of time. So, as in the film forming area 20 shown in FIG. 3, it is generally preferable that the film forming area is formed like a spool. For this purpose, it is preferable to place a film forming area limiting member formed like a half-moon in the flying route of the film forming particles, to define the form of the film forming area like a spool with arcs in the progression direction of the substrate. The film forming area limiting member is manufactured at first, for example, based on the cosine law (the law that the thickness of the film formed is proportional to the third or fourth power of the cosine of the angle formed between the film forming particle flying direction and the film forming particle flux axis), and is used to repeat film forming experiments till satisfactory film thickness and refractive index distributions are obtained, for finally deciding the optimum form. It is also preferable to control the thickness of the film by moving the film forming area limiting member vertically or in the substrate progression direction. When different film forming particle generating materials are used, it is preferable to exchange the film forming area limiting member for every material since the flying distribution is different from material to material.

The control of film forming process by using the method (2) is described below. Concretely this is to change the traveling speed of the substrate on which a film to be formed depending on the thickness of the film formed on the film formation monitor. This is to control the length of time during which the surface of the substrate on which a film to be formed is exposed to film forming particles, like the method (1). In general, the amount of film forming particles flying from a film forming source or its kinetic energy depends on the states of the vacuum vessel such as vacuum degree and the contamination of the vessel, and the effect of degassing from supplied substrates. So, in order that a homogeneous film can be formed irrespective of the variation of the formed film due to these factors, the film speed of passage is adjusted while the change of the thickness of the film formed on the film formation monitor (i.e., film forming rate) is monitored. For example, such control is preferable that if the film forming rate is high, the substrate speed of passage is raised, and that on the contrary if the film forming rate is low, the substrate speed of passage is lowered.

The control of film forming process using the method (3) is described below. In this method, depending on the thickness of the film formed on the film formation monitor, the energy applied to the generation source is adjusted. The adjustment allows the number of film forming particles per unit time reaching the film forming area and the energy of film forming particles to be controlled. For example, when the energy by an electron gun is given to the film forming particle generating region of a film material, the film forming process can be controlled in such a manner that the filament current of the electron gun is made smaller if the film forming rate is high, and that the filament current of the electron gun is made larger if the film forming rate is low. This method also allows the feedback control of the process by measuring the thickness of the film formed on the film formation monitor.

The control of film forming process by using the method (4) is described below. Even if the number of film forming particles reaching the film forming area is the same, a higher surface temperature of the substrate on which a film to be formed results in a higher film forming rate and may result in a higher refractive index, depending on the kind of the film formed. This nature can be used to control the film forming process such as film forming rate, refractive index, etc. by adjusting the surface temperature of the substrate on which a film to be formed. The heater preferably used in this case can be a halogen lamp using the radiation of light, or a sheath heater (micro heater) or nichrome heater mainly intended for infrared radiation and thermal conduction. The controller used can be of on-off control type, but a controller allowing PID control can be preferably used.

Furthermore it is preferable to measure the film forming rate of film forming process by monitoring the thickness of the film formed on the film formation monitor, and to control the film forming process based on the obtained film forming rate. According to a finding by the inventors, in no less cases, the film forming rate has a correlation with the physical properties of the film formed. For example, in the formation of a $TiO_2$ film, $TiO_2$ in its molten state at a film forming particle generation source becomes $Ti_3O_5$ to fly in vacuum, and during flying or on the substrate, it causes oxidation-reduction reaction with $O_2$, to form a $TiO_2$ film. The oxidation-reduction reaction is greatly affected by the kinetic energy of $Ti_3O_5$ particles. The kinetic energy of film forming particles is a physical quantity with a correlation with the flying velocity of the film forming particles, and has an intense correlation with the film forming rate. The inventors found that a thin film with preferable physical properties can be formed by controlling the film forming rate. For example, at a specific film forming rate, an unabsorbable film with a high refractive index can be formed in some cases. In such cases, it is preferable to stabilize the film forming rate at an optimum value. Furthermore, if the film forming rate is changed periodically, the physical properties of the film can be changed periodically in other cases. The film materials which can be controlled in physical properties by specifying the film forming rate include ITO (indium tin oxide), $SnO_2$, $In_2O_3$, ZnO, MgO, etc. respectively recently used in LCDs, etc.

In the present invention, a preferable method for controlling the film thickness distribution and the film performance distribution is to specially design the film forming particle generation source. That is, to keep the film thickness distribution and the film performance distribution constant over time, it is preferable to move the film forming particle generating material to the film forming particle generating region continuously at a certain speed, for eliminating the temporal change in the form of the molten portion. This assures that the optical thin films required to be highly accurate such as antireflection optical filters have a uniform film thickness distribution and a uniform performance distribution in the progression direction of substrates on which a film to be formed.

In the present invention, especially when vapor deposition is applied for substrates on which a film to be formed made of a resin, it is preferable in some cases that the distances between the substrates on which a film to be formed and the film forming particle generation source are 500 mm or more. Distances of 800 mm or more are more preferable. If the distances are shorter than 500 mm, the resin substrates may be greatly affected and damaged by the radiation heat from the film forming particle generation source in some cases. In the case of ITO films or MgO films, etc., reactive vapor deposition is often used, but due to insufficient reaction with oxygen gas, color absorbable films may be formed in some cases. Furthermore, because of likelihood to be affected by the dispersion of the film forming particle generation source, unevenness in film thickness may also be caused.

Furthermore, in the present invention, stockers are installed in a film forming chamber. In this arrangement, when especially substrates made of a resin are handled, the substrates can be sufficiently heated and degassed to have a film with very excellent physical properties to be formed on each of them since the substrates on which a film to be formed can be kept in a high vacuum area for a long period of time. As another advantage, the substrates on which a film to be formed can pass smoothly.

Figure 24:
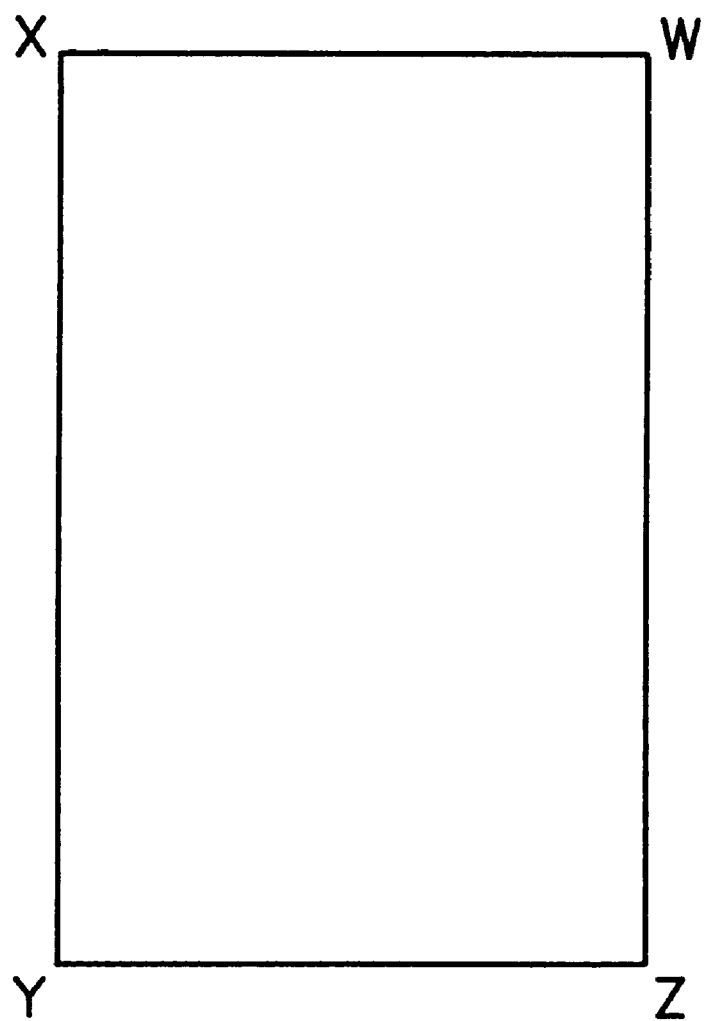
FIG. 24 A drawing showing a substrate with a thin film (substrate holder) of the present invention.

In the present invention, as for the structure of a multi-stage stocker, it is preferable that the plurality of stages are perpendicular to the direction in which the substrates on which a film to be formed are fed through the film forming area, and that the direction in which the substrates on which a film to be formed are relocated to and from agrees with the direction in which the substrates on which a film to be formed are passed through the film forming area. If the direction in which the plurality of stages are arranged in the stocker, the direction in which the substrates on which a film to be formed are relocated to and from the stocker and the direction in which the substrates on which a film to be formed are passed through the film forming area are three-dimensional (in three axial directions), a complicated mechanism is necessary for changing the substrates on which a film to be formed in direction, and since the mechanism must be kept in vacuum, the vacuum seal of the drive is very difficult. In the present invention, the plurality of stages are perpendicular to the direction in which the substrates on which a film to be formed are passed through the film forming area, and the direction in which the substrates on which a film to be formed are relocated to and from are the same as the direction in which the substrates on which a film to be formed are passed through the film forming area. So, the substrates can be relocated with the retainer of substrates (substrate holders) in the multi-stage stocker kept almost at the same level as the retainers used for relocating the substrates (substrate holders) to or from the stocker, and if the substrates (substrate holders) are fed in the direction in which they are relocated from, they can be exposed to the film forming area, to allow a reasonable mechanism to be adopted. For example, a case where the stocker is driven vertically to relocate the substrates (substrate holders) horizontally while the substrates (substrate holders) are fed through the film forming area horizontally is described below. If the stocker has a structure to receive a substrate (substrate holder) at sides XY and ZW shown in FIG. 24 and the direction in which the substrate is relocated to and from the stocker agrees with the direction in which the substrate is fed through the film forming area, with rollers arranged in this direction, then the substrate (substrate holder) vertically moved by the stocker can be received by the rollers at the illustrated sides XW and YZ. So, the substrates can be relocated very smoothly advantageously. Furthermore, since the vacuum seal is required for the drive shaft used for vertical driving and the drive shaft used for horizontal carrying, design is very easy and maintenance is also easy. Moreover, troubles are unlikely to occur in production.

In addition, in this case, the substrates are carried horizontally by rollers, and the rollers can be driven by a servo motor. So, the substrate carrying speed can be set very accurately. Furthermore, such speed control as to accelerate the substrates (substrate holders) before the film forming area, and to keep the speed constant in the film forming area, and then to accelerate after the film forming area, for subsequent deceleration is also very easy. Therefore, it is very preferable to use this structure.

As for the method for heating the substrates in the present invention, it is preferable to heat in the film forming chamber and in the loading or unloading chamber upstream or downstream of it, or to heat in the loading or unloading chamber only, or to heat in all the chambers. However, it is preferable in view of uniform heating that heaters are inserted in the multi-stage structure for substrates. Namely, it is preferable that the structure of the stocker has substrate portions, heater portions, substrate portions and heater portions arranged alternately. It is preferable to adopt this structure in the stockers upstream and downstream of the film forming area in the film forming chamber and also in the loading or unloading chamber, or further in the loading or unloading chamber upstream and downstream thereof.

In the present invention, it is preferable that the film forming chamber is equipped with a means which allows the process conditions to be changed. For example, a gas introducing means is equipped with a device to allow the gas volume to be adjusted. In this case, when a film consisting of different materials is formed, the vacuum degree can be changed for forming each layer. In the case of an optical thin film like an antireflection optical filter, the refractive index of the film can be controlled or changed often by the vacuum pressure acting during film formation. A thin film like $ZrO_2$ film is a good example. In the case of such a thin film, the means as described above is very effective. Also when thin films are formed by different techniques such as ion assisted evaporation, high frequency ion plating and ordinary vapor deposition, an electron gun as their evaporation means can be used commonly, depending on cases, and this is very advantageous in view of cost reduction of apparatus. Furthermore, it is very preferable if process conditions can be changed within the same evacuation mechanism with high vacuum kept, since different kinds of treatment can be carried out in the same vacuum chamber.

This is very effective in the case of a multi-layer film in which many high refractive index layers and many low refractive index layers are repeated like a band pass filter. For forming a multi-layer film consisting of as many as 15 layers to 30 layers, if film forming chambers as many as the layers are used, the entire film forming apparatus becomes very long (large), but if the apparatus of the present invention is used, one film forming chamber can be used to form many layers of a film smoothly by reciprocating substrates in the direction to pass through the film forming area, to allow production by a very small apparatus.

If substrate with a thin film which have been once fed through a vacuum treatment apparatus are taken out and fed again through the apparatus, the handling trouble is enormous, and especially physical properties, particularly the adhesion between layers is greatly affected. A multi-layer film formed by repeating the actions of exposing a film once fed through a vacuum treatment apparatus to the open air and feeding the film again through the vacuum treatment apparatus causes peeling in a cross-hatched film peeling test, but a multi-layer film obtained by treating in a film forming chamber with stockers in vacuum according to the present invention is good in adhesion between layers, and does not pose any problem in the same cross-hatched film peeling test.

In the present invention, in the case of an antireflection optical film used as a front panel, etc. of a display screen, the outermost layer is often treated to be water repellent for prevention of contamination. For example, there is a case where a material impregnated with a fluorine based organic solution is used for vapor deposition. In such a case, it can happen that it is preferable to use another film forming chamber since the fluorine based organic material inhibits the inter-layer adhesion of the film. Also when a layer quite different in film forming means is formed, it is often practiced to use another film forming chamber.

The present invention is described below in reference to examples, but is not limited thereto or thereby.

EXAMPLE 1

The film forming apparatus shown in FIG. 1 was used to form a thin film on each of substrates on which a film to be formed, for manufacturing substrate with a thin film. The substrate with a thin film were intended to be used as antireflection filters of displays, and the thin films were optical thin films requiring strict film thickness control.

The film forming process was vacuum evaporation, ion assisted evaporation or high frequency ion plating. The substrates on which a film to be formed used were made of a transparent plastic material. The film forming area had a width of 1200 mm. The installation area of the apparatus was about 100 m², and two operators were necessary for operating the apparatus. Since the number of film forming chambers was one, the number of evacuation pumps could also be one, and it was not necessary to prepare many electron guns as means for generating film forming particles. So, the apparatus could be very low in cost.

The film formation monitor was arranged outside the film forming area, to eliminate the influence of the substrate size.

The distance between the film formation monitor and the film forming particle generation source was longer than the shortest distance between the film forming area and said generation source and shorter than the longest distance. The direction normal to the film formation monitor agreed with the direction in which the film forming particles flew at the position of the film formation monitor. The thickness of the film formed on the film formation monitor was measured by using both a light interference type film thickness meter and a quartz type film thickness meter.

The film composition was as shown in Table 1. The film forming process is described below.

Figure 10:
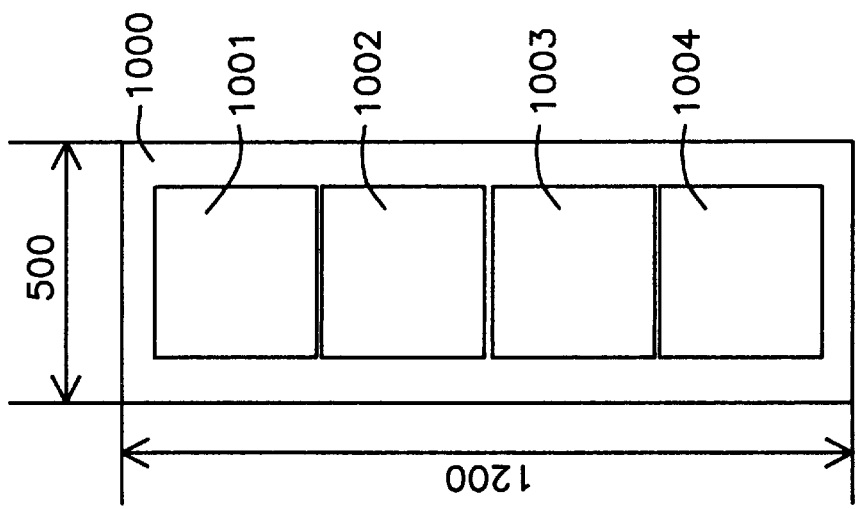
FIG. 10 A drawing showing an example of substrates on which a film to be formed set on a substrate holder in one example of the method for manufacturing substrate with a thin film of the present invention.

Four organic silane hard-coated substrates PMMA (330 mm×260 mm×2 mm) for surface antireflection filters of displays with a diagonal line length of 14 inches (35 cm) were set on one holder of substrate on which a film to be formed (500 mm×1200 mm). This state is shown in FIG. 10. Twenty substrate holders of this type were prepared, to hold 20 groups of substrates. The substrates were heated to 80° C. by micro heaters and halogen lamps.

(0) As pretreatment, a plasma generation type ion gun (Model RIS ion gun produced by Shincron K. K.) of the film forming chamber was used to accelerate oxygen ions at an acceleration voltage of 500 V at an accelerating current of 100 mA, for irradiating the area where the substrates on which a film to be formed were fed through, while the twenty groups of substrates on which a film to be formed were fed at a rate of 3 m/min, to be exposed to the oxygen ions. Until the feeding of all the twenty groups of substrates on which a film to be formed was completed, it took 4 minutes.

(1) $ZrO_2$ for the first layer was heated (degassed) for 2 minutes, when the temperature of the $ZrO_2$ particle generating region reached a steady state. Then, the shutter was opened, and the stability of film formation was confirmed for 30 seconds on the film formation monitor. Then, the twenty groups of substrates on which a film to be formed were started to be fed, for exposure in the film forming area. The energy of the electron gun to the film forming particle generation source was kept constant, and the speed of passage was controlled to keep the formed film thickness constant. When the feeding of all the twenty groups of substrates on which a film to be formed was completed, the shutter was closed. The time taken until the shutter was closed was about 5 minutes.

(2) $SiO_2$ for the second layer was preliminarily heated while the first layer was vapor-deposited (the preliminary heating in this case means to let the temperature of the film forming particle generating region reach a steady state), and as soon as the shutter was closed in step (1), the shutter provided above $SiO_2$ was opened. The stability of film formation was confirmed for 30 seconds on the film formation monitor, and the twenty groups of substrates on which a film to be formed were started to be fed, for exposure in the film forming area. The energy of the electron gun to the film forming particle generation source was kept constant, and the speed of passage was controlled to keep the formed film thickness constant. After the feeding of all the twenty groups was completed, the shutter was closed. The time taken until the shutter was closed was about 2 minutes.

(3) I.T.O. for the third layer was preliminarily heated while the second layer was vapor-deposited, and as soon as the shutter was closed in step (1), oxygen was introduced to keep the pressure in the film forming chamber at $3.0 \times 10^{-2}$ Pa. An antenna provided in the film forming chamber was used to apply a high frequency of 13.56 MHz at 500 W, to produce an oxygen plasma state, and furthermore, a plasma generation type ion gun was used to ionize oxygen and then to accelerate the oxygen ions, for irradiating the substrates on which a film to be formed in the exposure direction, while the shutter provided above I.T.O. was opened. The stability of film formation was confirmed for 30 minutes on the film formation monitor, and the twenty groups of substrates on which a film to be formed were started to be fed, for exposure in the film formation area. The energy of the electron gun to the film forming particle generation source was kept constant, and the speed of passage was controlled to keep the formed film thickness constant. After the feeding of all the twenty groups of substrates on which a film to be formed was completed, the shutter was closed. The time taken until the shutter was closed was about 5 minutes.

(4) $TiO_2$ for the fourth layer was preliminarily heated while the third layer was vapor-deposited, and as soon as the shutter was closed in step (3), oxygen was introduced to keep the pressure in the film forming chamber at $1.0 \times 10^{-2}$ Pa. The shutter provided above $TiO_2$ was opened, and the stability of film formation was confirmed for 30 seconds on the film formation monitor. Then, the twenty groups of substrates on which a film to be formed were started to be fed, for exposure in the film forming area. The energy of the electron gun to the film forming particle generation source was controlled by monitoring the deposition rate of the film formed on the sensor of a quartz type film thickness meter and feeding back the output to keep the deposition rate constant. The speed of passage was controlled to keep the formed film thickness constant. After the feeding of all the twenty groups of substrates on which a film to be formed was completed, the shutter was closed. The time taken until the shutter was closed was about 5 minutes.

(5) $SiO_2$ for the fifth layer was preliminarily heated while the fourth layer was vapor-deposited, and as soon as the shutter was closed in step (4), the shutter provided above $SiO_2$ was opened. After the stability of film formation was confirmed for 30 seconds on the film formation monitor, the twenty groups of substrates on which a film to be formed were started to be fed, for exposure in the film forming area. The energy of the electron gun to the film forming particle generation source was controlled to keep the film forming rate of film forming particles constant, and the speed of passage was controlled to keep the formed film thickness constant. After the feeding of all the twenty groups of substrates on which a film to be formed was completed, the shutter was closed. The time taken until the shutter was closed was about 2 minutes.

One tact time for forming a film on each substrate of the twenty groups of substrates on which a film to be formed obtained by adding mechanical loss time to the time of steps (1) through (5) was 30 minutes.

The tact cycle of operation was repeated 140 times, and the time taken for the operation including the initial evacuation and final unloading was 72 hours (3 days). In this operation, 11,200 surface antireflection filters of displays of 14 inches (35 cm) were produced (20 holders×4 substrates× 140 times).

Comparative Example 1

Figure 6:
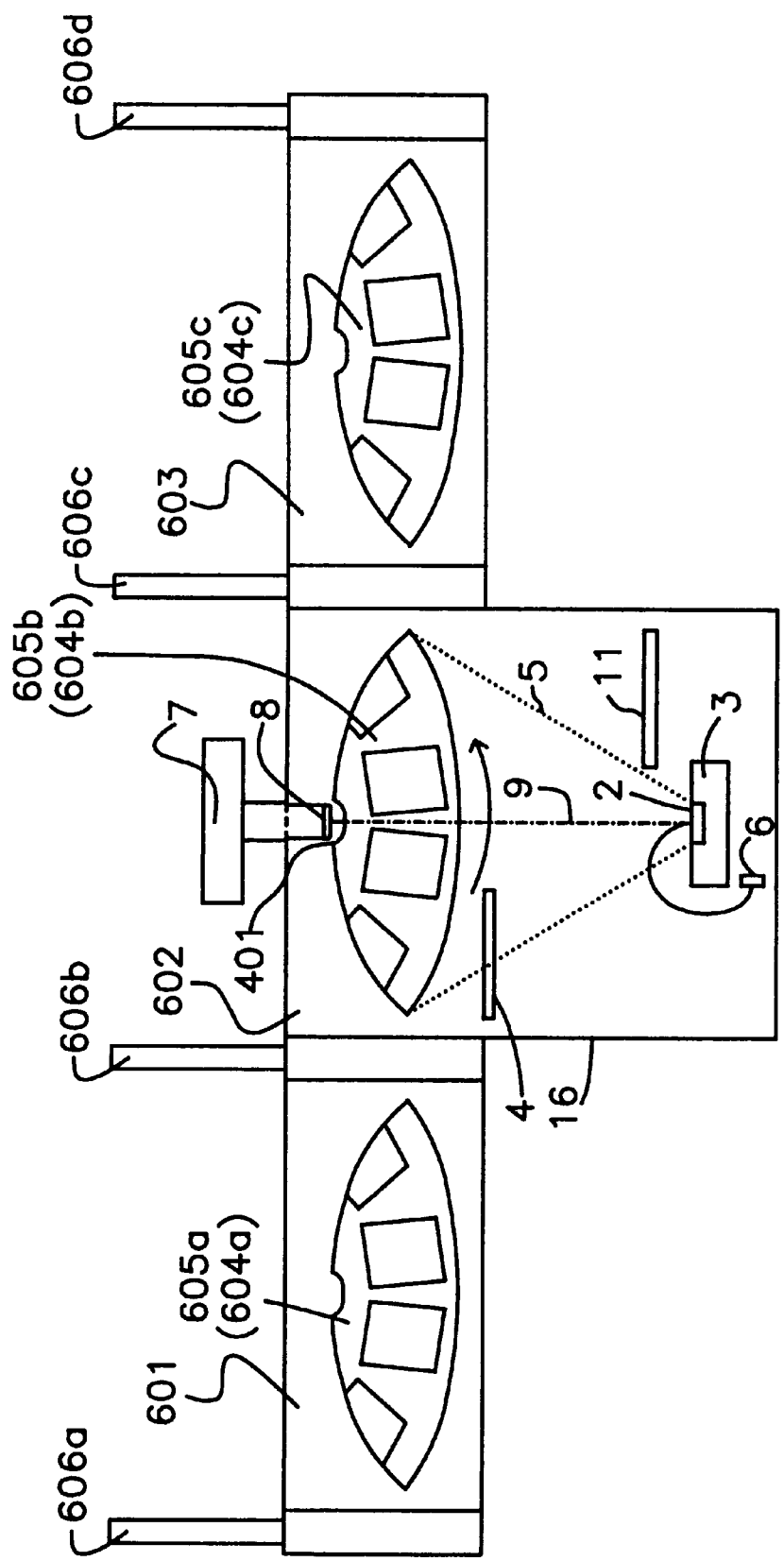
FIG. 6 A drawing showing a conventional method for continuously manufacturing substrate with a thin film.
Figure 7:
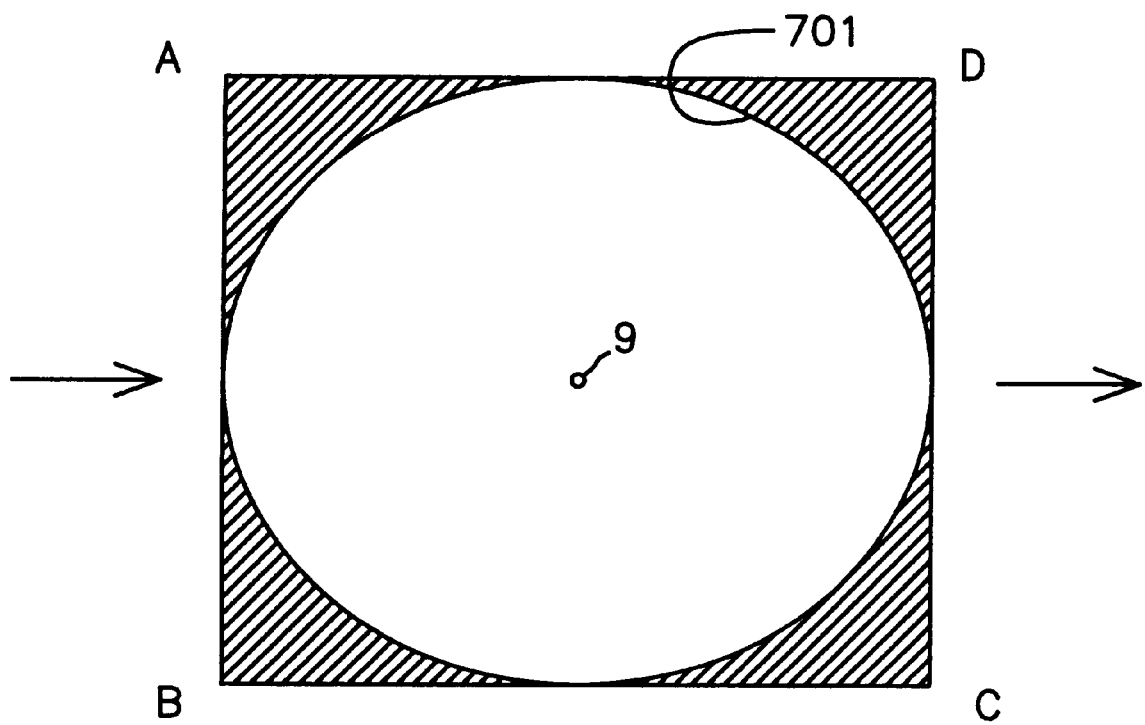
FIG. 7 A drawing showing the film forming area of the present invention in comparison with that of a conventional example.
Figure 8:
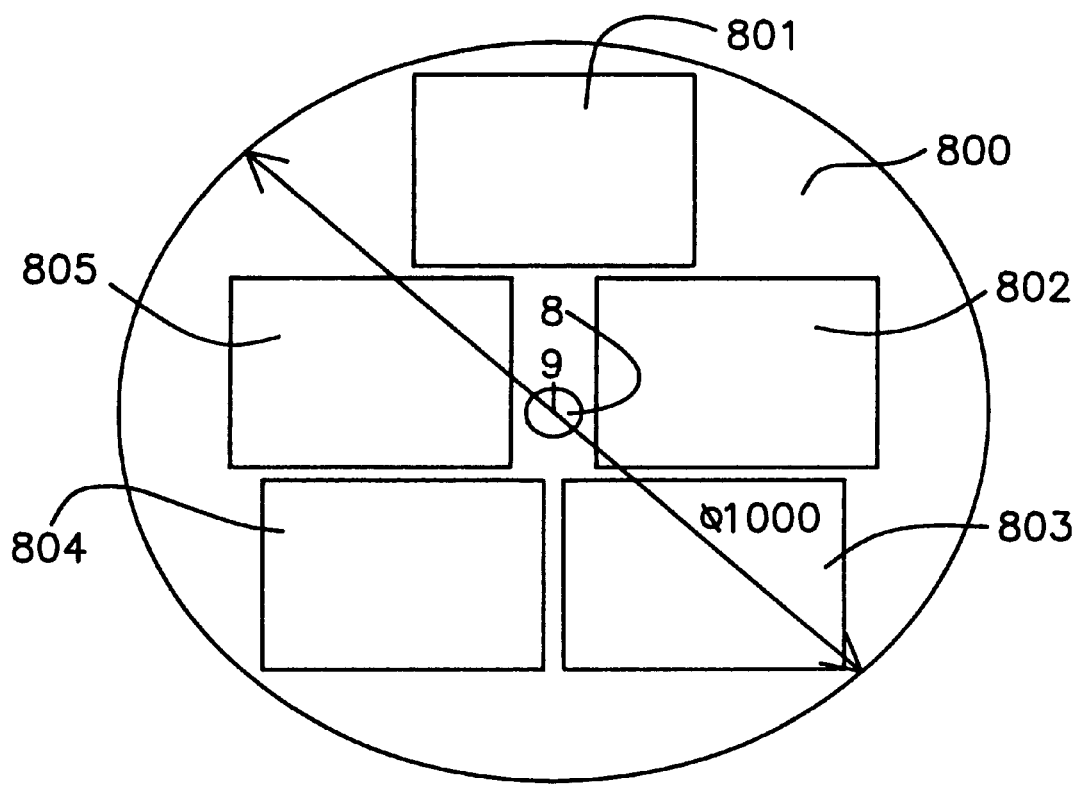
FIG. 8 A drawing showing an example of substrates on which a film to be formed set on a substrate holder in a conventional example.

An apparatus (shown in FIG. 6) similar to the continuous vacuum thin film forming apparatus described in Japanese Patent Laid-Open (Kokai) No. 3-193873 was used to form a thin film on each of substrates on which a film to be formed, for manufacturing substrate with a thin film. The substrate with a thin film were intended to be used as antireflection filters of displays, and the thin films were optical thin films requiring strict film thickness control.

The film forming process was vacuum evaporation, and the substrates on which a film to be formed were made of a transparent plastic material. The film forming area had a width of 1200 mm. That is, an apparatus capable of forming a film forming area with a width of 1200 mm was used. The installation area of the apparatus was about 100 m$^2$, and two operators were necessary for operating the apparatus.

Figure 4:
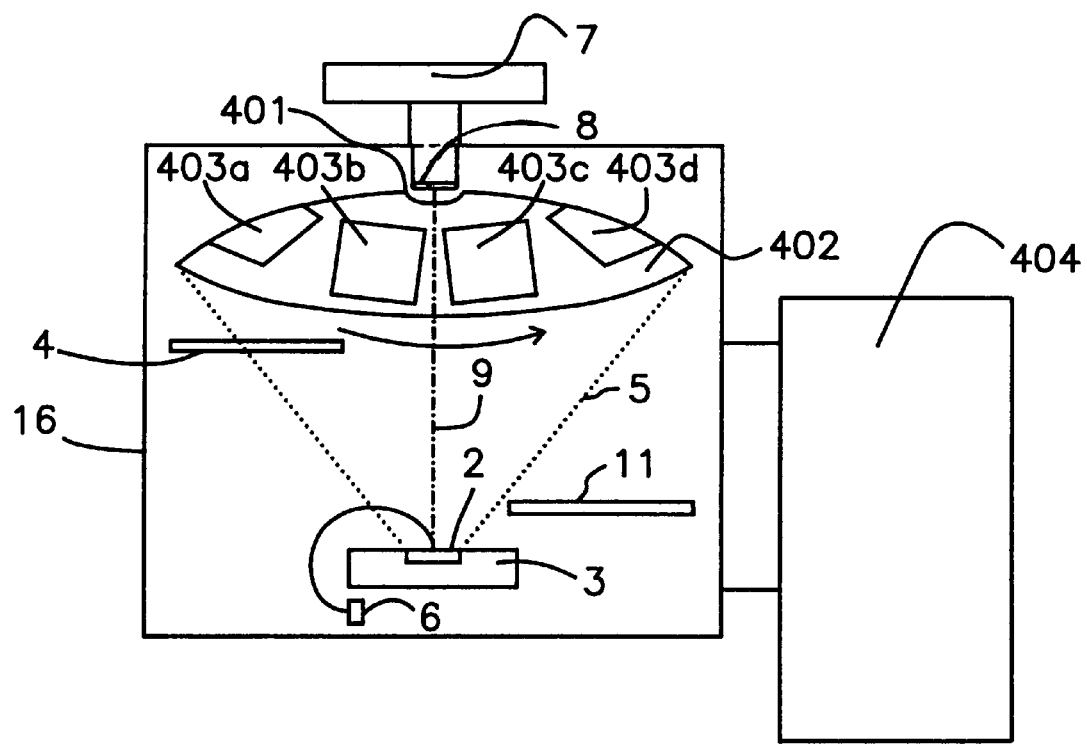
FIG. 4 A drawing showing a conventional method for manufacturing substrate with a thin film.
Figure 5:
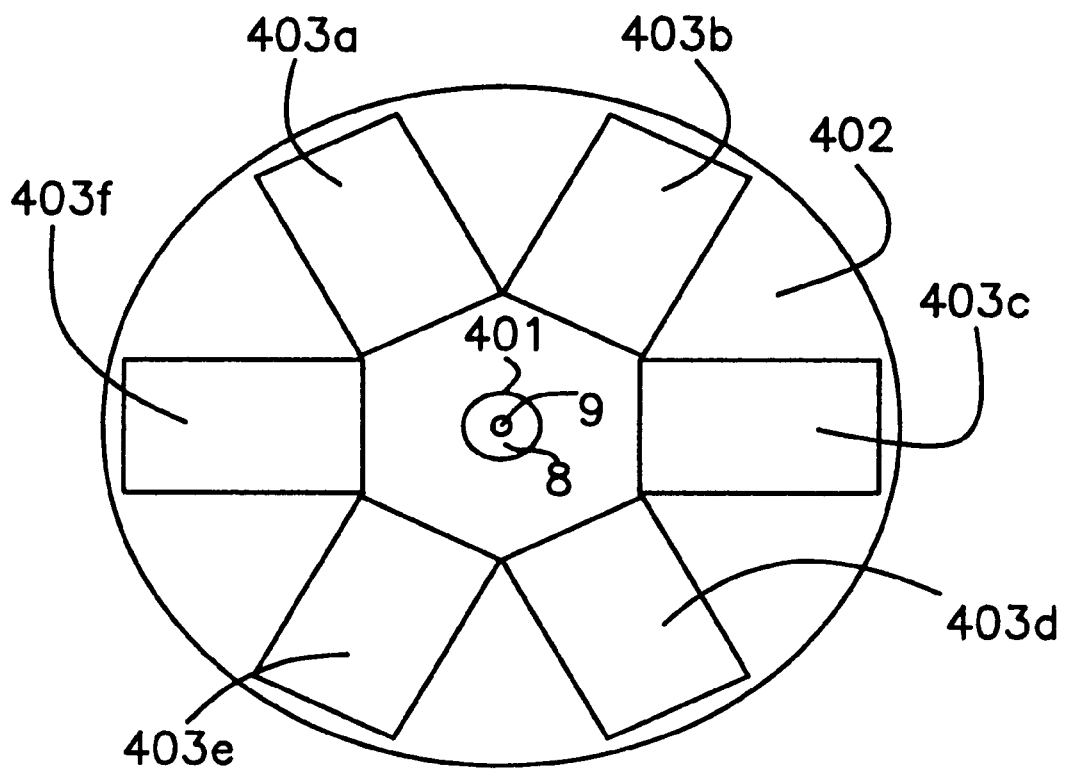
FIG. 5 A drawing showing a substrate holder in a conventional method for manufacturing substrate with a thin film.

The film formation monitor was placed at the center of a domed substrate holder as shown in FIG. 4, and the domed substrate holder had a hole at the center. The thickness of the film formed on the film formation monitor was measured by using a light interference type instrument.

The film composition was as shown in Table 1. The film formation process is described below.

Figure 13:
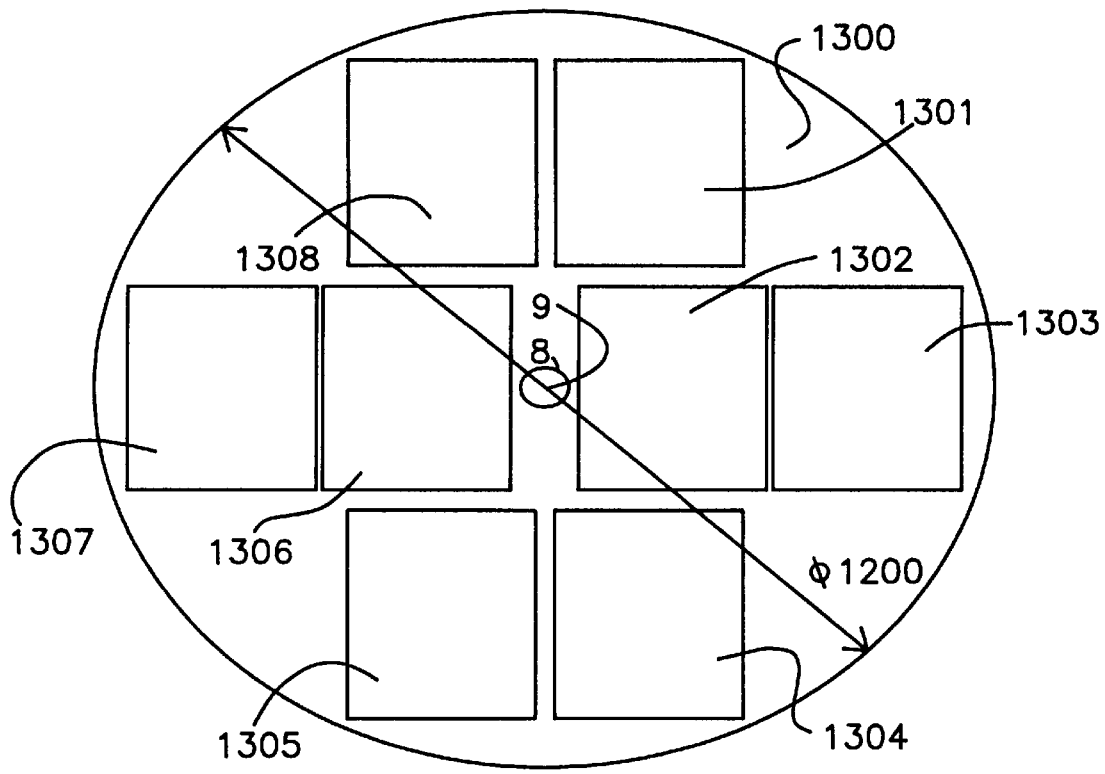
FIG. 13 A drawing showing an example of substrates on which a film to be formed set on a substrate holder in a conventional method for manufacturing substrate with a thin film.

Eight organic silane hard-coated substrates PMMA (330 mm×260 mm×2 mm) for surface antireflection filters of displays with a diagonal line length of 14 inches (35 cm) were set in one domed substrate holder (1200 mm in diameter) to fill the available area of the holder to the maximum extent. This state is shown in FIG. 13. The substrates were heated to 80° C. by micro heaters and halogen lamps.

(0) As pretreatment, while the domed substrate holder was rotated horizontally, a hot cathode electron bombarded ion gun (Model KIS ion gun produced by Shincron K. K.) was used to accelerate oxygen ions at an accelerating voltage of 500 V at an accelerating current of 100 mA, for irradiating the substrates on which a film to be formed for 1 minute. Subsequently, during film formation, the domed substrate holder was kept rotated horizontally.

(1) ZrO$_2$ for the first layer was heated (degassed) for 3 minutes, to let the temperature of the ZrO$_2$ particle generating region reach a steady state. Then, the shutter was opened, to form a film on each of the eight substrates on which a film to be formed, and the film forming monitor was monitored to confirm that the intended film thickness was reached. Then the shutter was closed. The time taken until the shutter was closed was about 1 minute.

(2) SiO$_2$ for the second layer was preliminarily heated while the first layer was vapor-deposited, and as soon as the shutter was closed in step (1), the shutter provided above SiO$_2$ was opened, to form a film on each of the eight substrates on which a film to be formed. After it was confirmed that the intended film thickness was reached on the film formation monitor, the shutter was closed. The time taken until the shutter was closed was about 1 minute.

(3) I.T.O. for the third layer was preliminarily heated while the second layer was vapor-deposited, and as soon as the shutter was closed in step (2), oxygen was introduced to keep the pressure in the film forming chamber at 3.0×10$^{-2}$ Pa. An antenna provided in the film forming chamber was used to apply a high frequency of 13.56 MHz at 500 W to produce an oxygen plasma state, and furthermore, an ion gun was used to ionize oxygen and then to accelerate the oxygen ions, for irradiating the substrates on which a film to be formed, while the shutter above I.T.O. was opened to form a film on each of the eight substrates on which a film to be formed. After it was confirmed that the intended film thickness was formed on the film formation monitor, the shutter was closed. The time taken until the shutter was closed was about 3 minutes.

(4) TiO$_2$ for the fourth layer was preliminarily heated while the third layer was vapor-deposited, and as soon as the shutter was closed in step (3), oxygen was introduced to keep the pressure in the film forming chamber at 1.0×10$^{-2}$ Pa. Then, the shutter provided above TiO$_2$ was opened to form a film on each of the eight substrates on which a film to be formed, and after it was confirmed that the intended film thickness was reached on the film formation monitor, the shutter was closed. The time taken until the shutter was closed was about 3 minutes.

(5) SiO$_2$ for the fifth layer was preliminarily heated while the fourth layer was vapor-deposited, and as soon as the shutter was closed in step (4), the shutter provided above SiO$_2$ was opened to form a film on each of the eight substrates on which a film to be formed. After it was confirmed that the intended film thickness was reached on the film formation monitor, the shutter was closed. The time taken until the shutter was closed was about 2 minutes.

One tact time for forming a film on each of the eight substrates on which a film to be formed obtained by adding mechanical loss time to the time of steps (0) through (5) was 18 minutes.

The tact cycle of operation was repeated 235 times, and the time taken for the operation including the initial evacuation and the final unloading was 72 hours (3 days). In this operation, 1,880 surface antireflection filters (8 substrates× 235 times) of displays of 14 inches (35 cm) were produced.

Compared to Example 1, even though the size of apparatus and the number of operators were the same, the productivity of Example 1 was as high as about 6 times that of Comparative Example 1 (11,200 films/1,880 films $^a$ 6 times).

TABLE 1

| From substrate | Layer forming material | Physical layer thicness |
| --- | --- | --- |
| 1st layer | ZrO2 | Approx.25nm |
| 2nd layer | SiO2 | Approx.20nm |
| 3rd layer | I.T.O | Approx.30nm |
| 4th layer | TiO2 | Approx.85nm |
| 5th layer | SiO2 | Approx.87nm |

EXAMPLE 2

Figure 11:
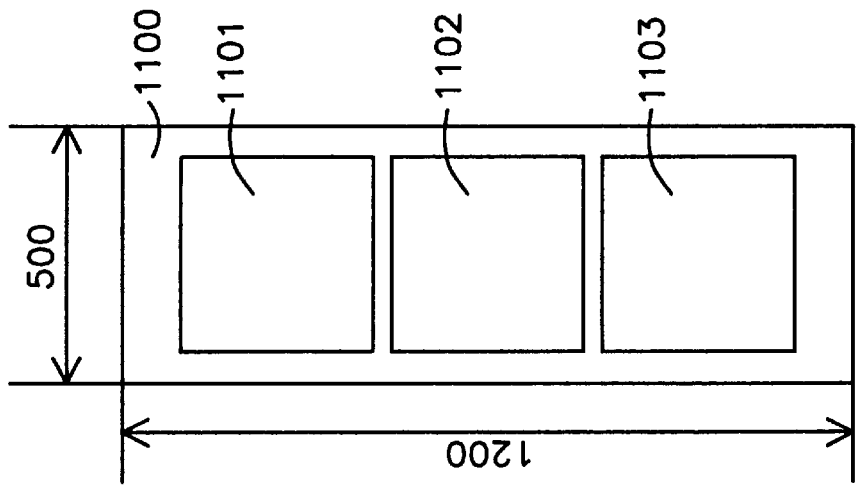
FIG. 11 A drawing showing another example of substrates on which a film to be formed set on a substrate holder in one example of the method for manufacturing substrate with a thin film of the present invention.

Films were formed as described in Example 1, except that/three substrates on which a film to be formed (310 mm×380 mm×2 mm) for surface antireflection filters of displays of 17 inches (43 cm) different in size from those used in Example 1 were used. The size of the substrate holders was remained the same as 500 mm×1200 mm. The state is shown in FIG. 11.

Since the same substrate holders were used, the process and tact cycle time were the same.

The tact cycle of operation was repeated 140 times, and the time taken for the operation including initial evacuation and final unloading was 72 hours (3 days). In this operation, 8,400 surface antireflection filters (20 holders×3 substrates× 140 times) of displays of 17 inches (43 cm) were produced.

Comparative Example 2

Figure 14:
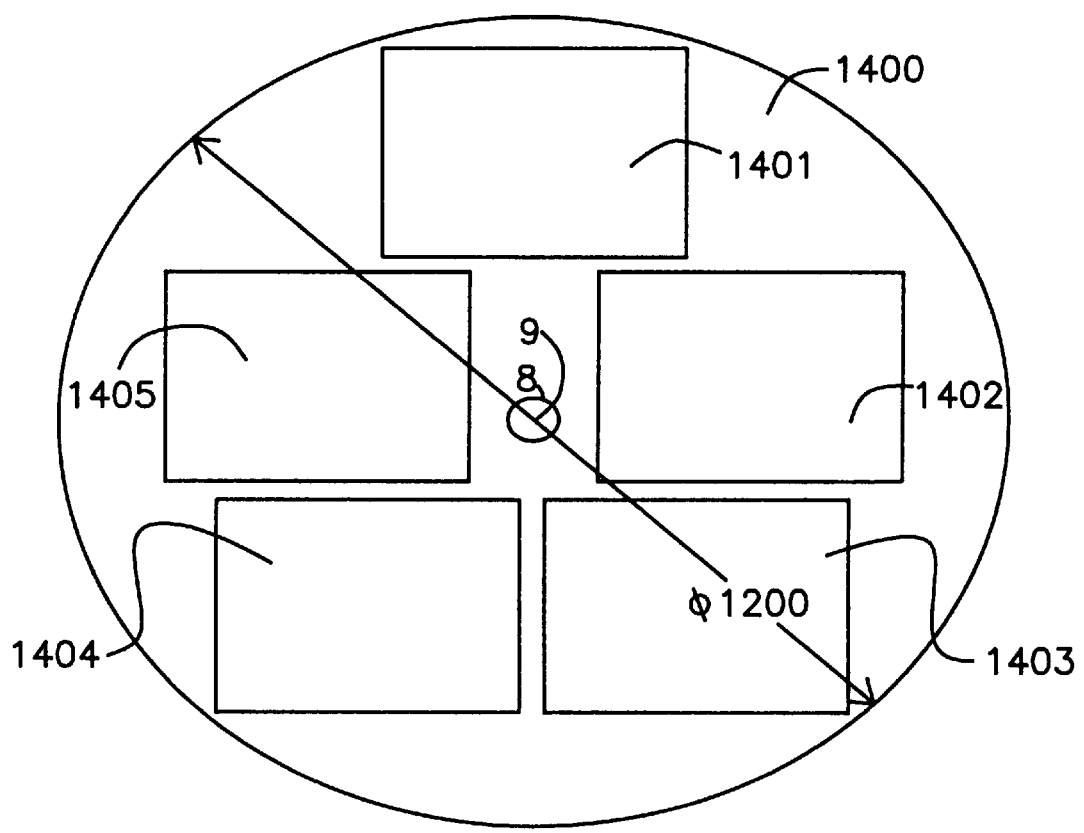
FIG. 14 A drawing showing another example of substrates on which a film to be formed set on a substrate holder in a conventional method for manufacturing substrate with a thin film.

Films were formed as described in Comparative Example 1, except that five substrates on which a film to be formed (310 mm×380 mm×2 mm) for surface antireflection filters of displays of 17 inches (43 cm) different in size from those used in Comparative Example 1 were used to fill the available area to the maximum possible extent. The size of the domed substrate holder (1200 mm in diameter) remained the same. The state is shown in FIG. 14.

Since the substrate holder was the same, the process and tact cycle time were the same.

This tact cycle of operation was repeated 235 times, and the time taken for the operation including initial evacuation and final unloading was 72 hours (3 days). In this operation, 1,175 surface antireflection filters (5 substrates×235 times) of displays of 17 inches (43 cm) were produced.

The productivity of Example 2 was as high as about 7 times that of Comparative Example 2 (8,400 films/1,175 films $a$ 7 times).

EXAMPLE 3

Figure 12:
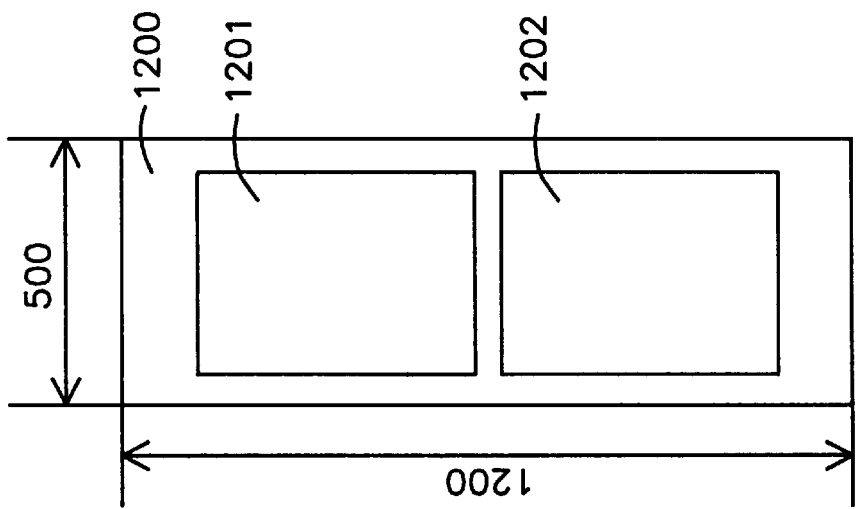
FIG. 12 A drawing showing a further other example of substrates on which a film to be formed set on a substrate holder in one example of the method for manufacturing substrate with a thin film of the present invention.

Films were formed as described in Example 1, except that two substrates on which a film to be formed (380 mm×460 mm×2 mm) for surface antireflection filters of displays of 20 inches (51 cm) different in size from those used in Example 1 were used. The size of the substrate holders was remained the same as 500 mm×1200 mm. The state is shown in FIG. 12.

Since the same substrate holders were used, the process and tact cycle time were the same.

The tact cycle of operation was repeated 140 times, and the time taken for the operation including initial evacuation and final unloading was 72 hours (3 days). In this operation, 5,600 surface antireflection filters (20 holders×2 substrates× 140 times) of displays of 20 inches (51 cm) were produced.

Comparative Example 3

Figure 15:
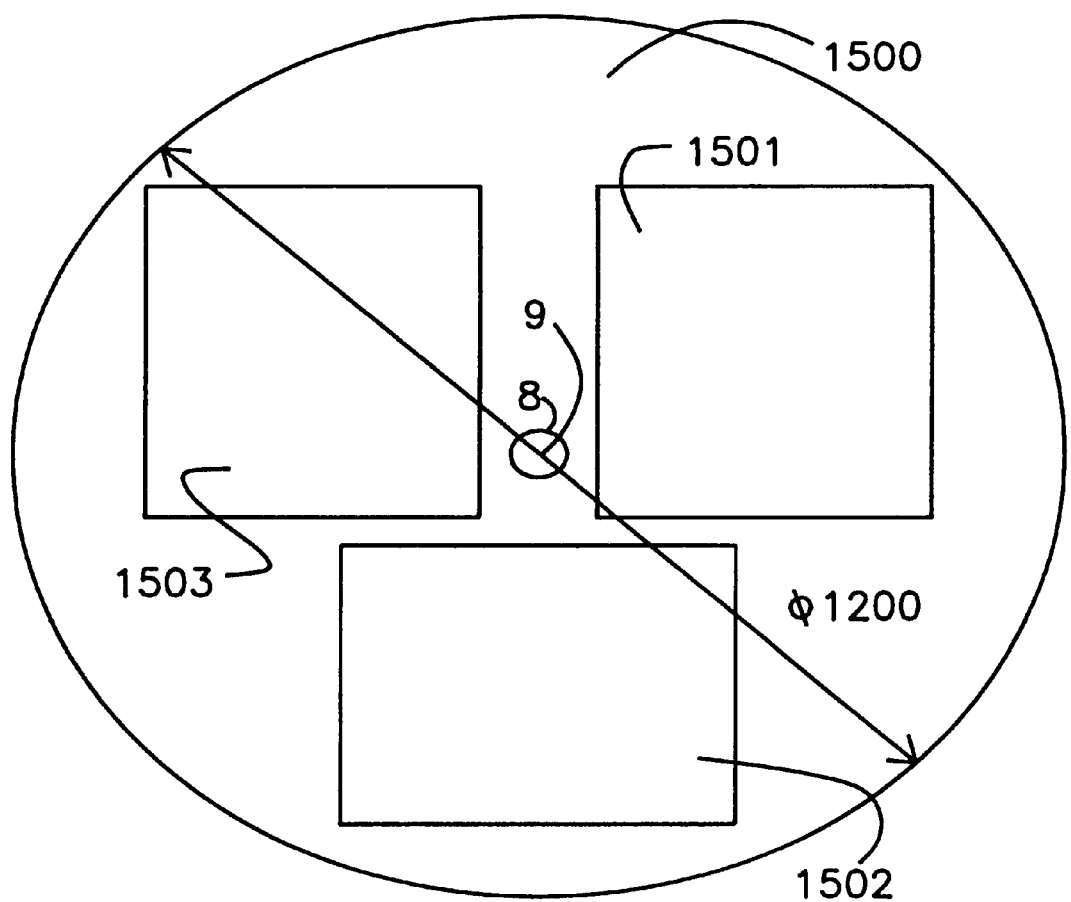
FIG. 15 A drawing showing a further other example of substrates on which a film to be formed set on a substrate holder in a conventional method for manufacturing substrate with a thin film.
Figure 16:
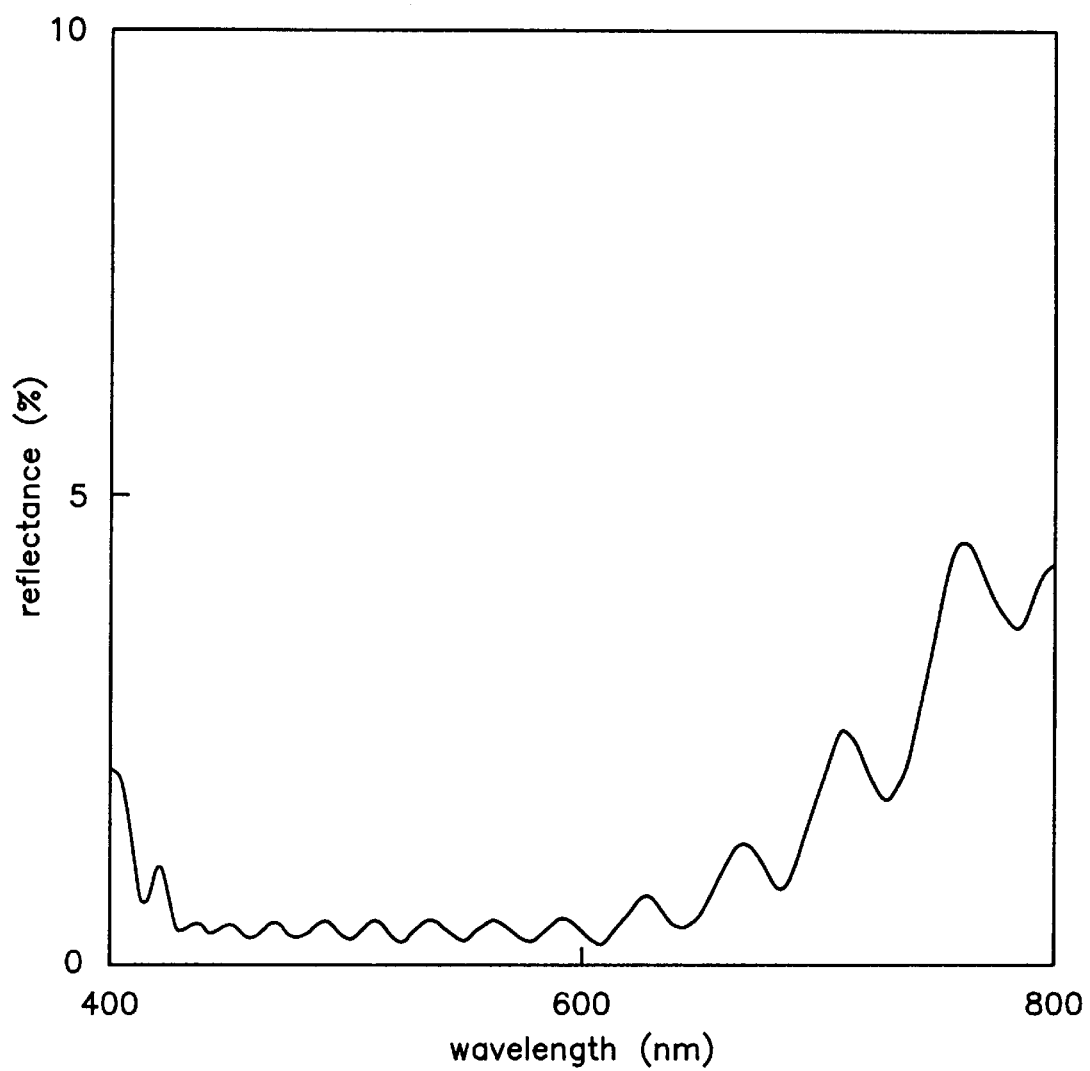
FIG. 16 A drawing showing an example of the spectral characteristic of an antireflection filter in Example 1 of the method for manufacturing substrate with a thin film of the present invention.
Figure 17:
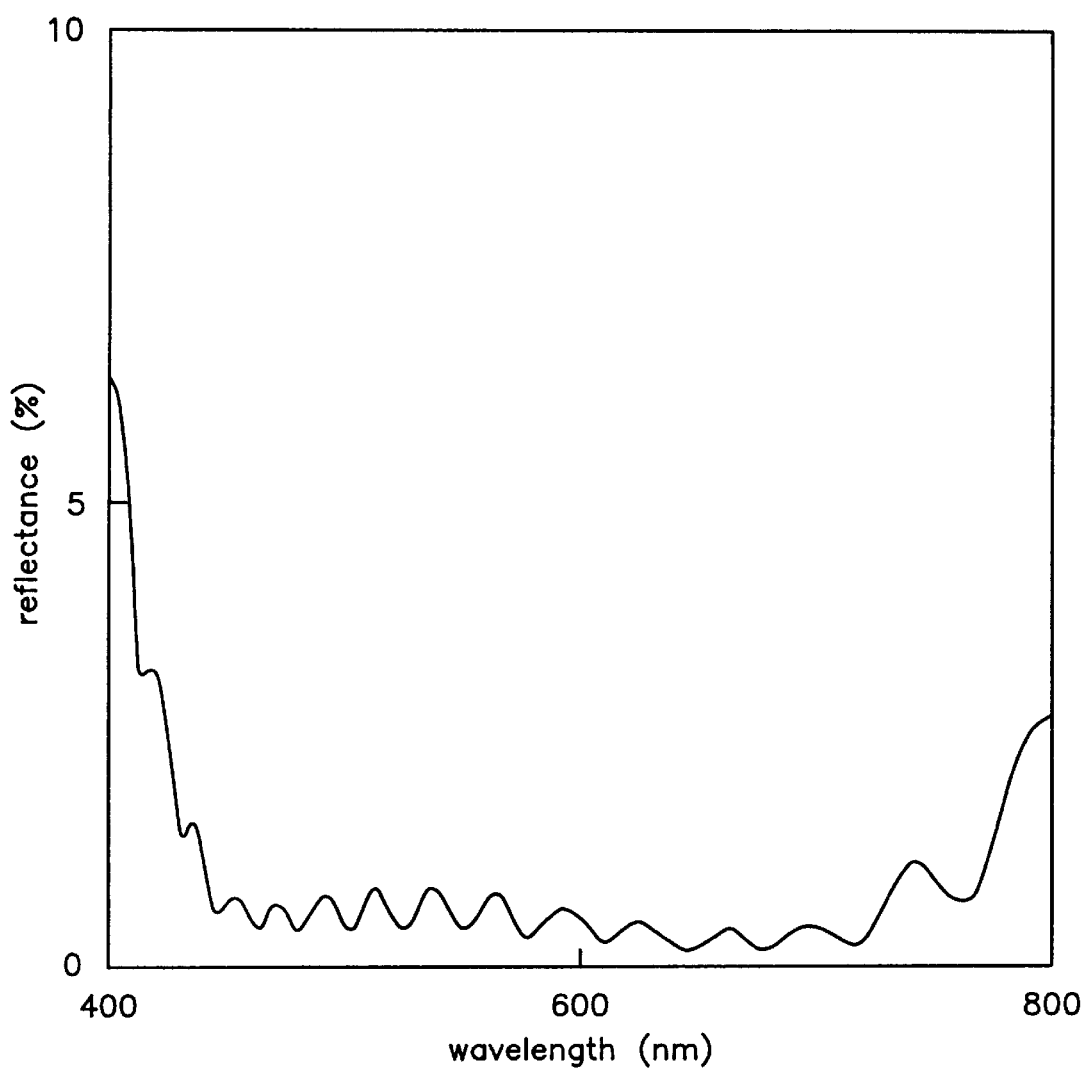
FIG. 17 A drawing showing an example of the spectral characteristic of an antireflection filter in Example 2 of the method for manufacturing substrate with a thin film of the present invention.
Figure 18:
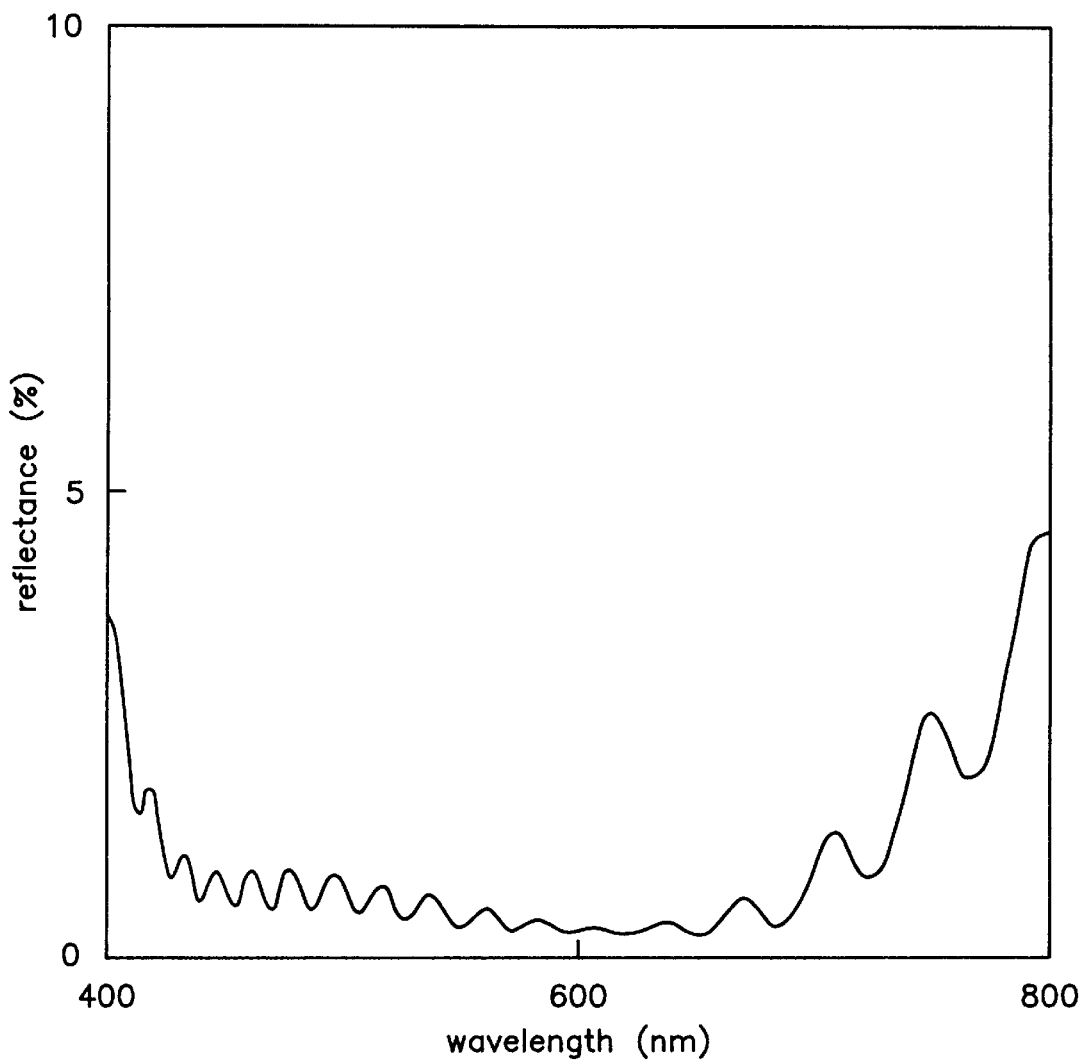
FIG. 18 A drawing showing an example of the spectral characteristic of an antireflection filter in Example 3 of the method for manufacturing substrate with a thin film of the present invention.
Figure 19:
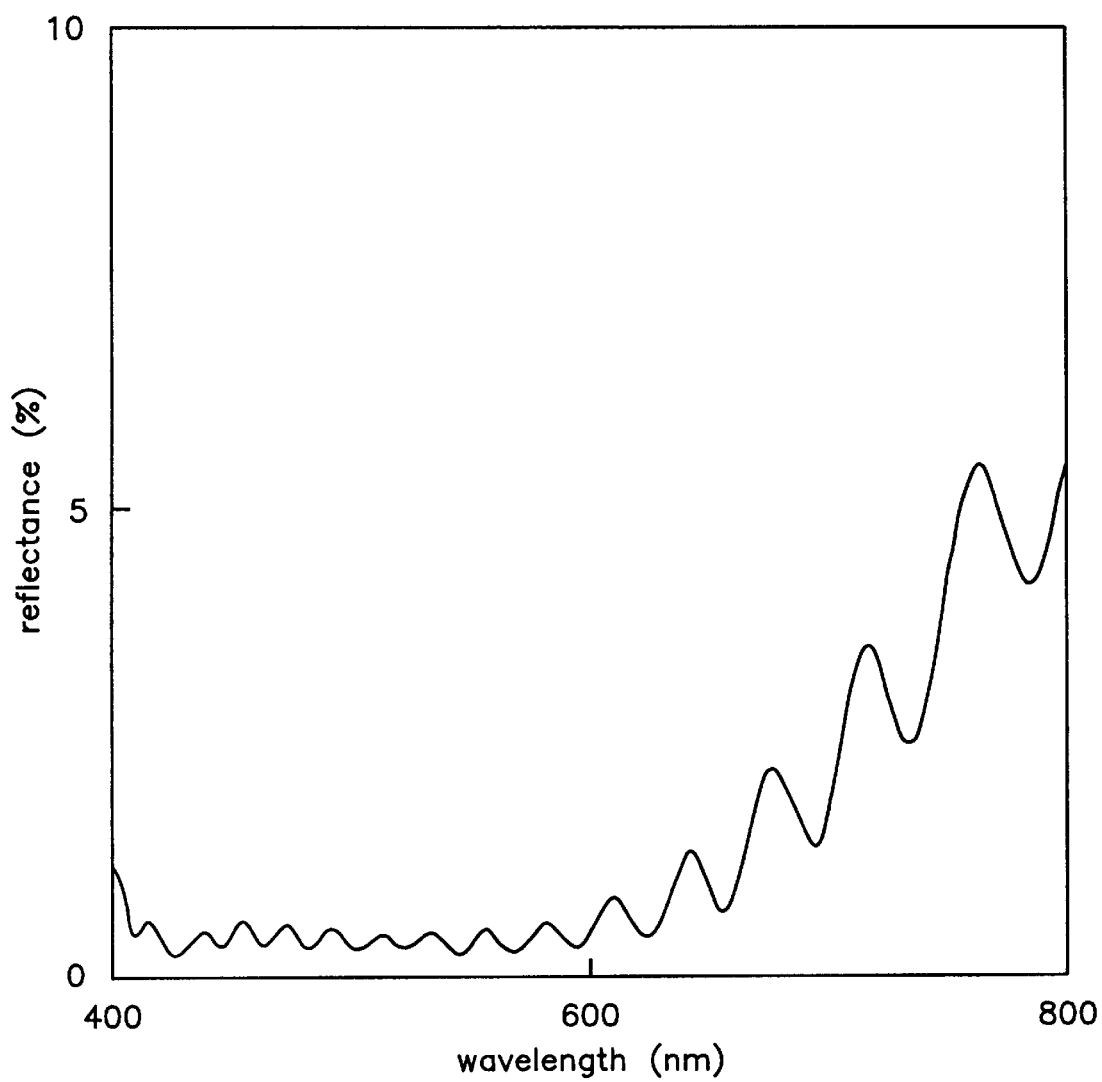
FIG. 19 A drawing showing an example of the spectral characteristic of an antireflection filter in Comparative Example 1 of a conventional method for manufacturing substrate with a thin film.
Figure 20:
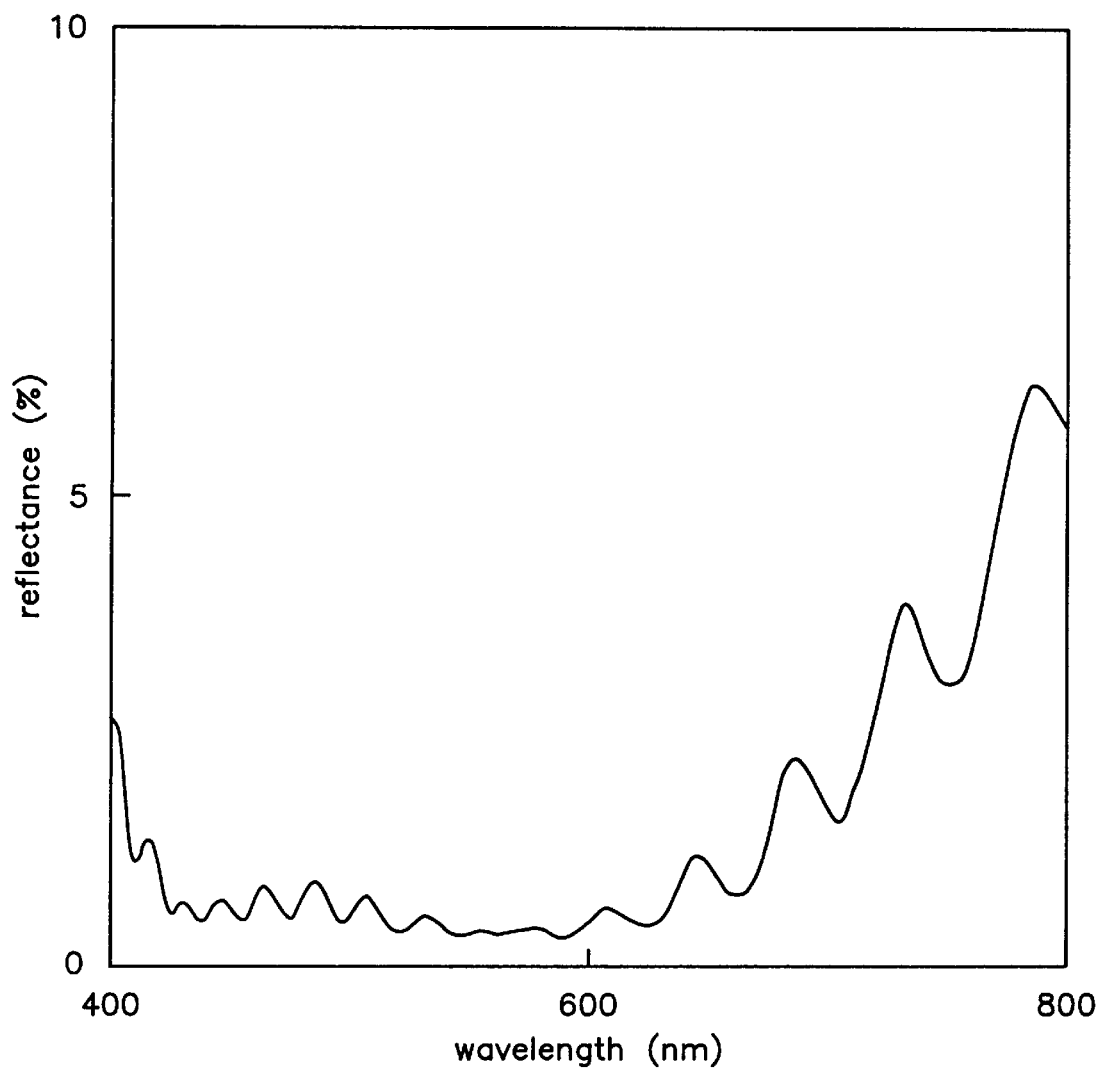
FIG. 20 A drawing showing an example of the spectral characteristic of an antireflection filter in Comparative example 2 of a conventional method for manufacturing substrate with a thin film.
Figure 21:
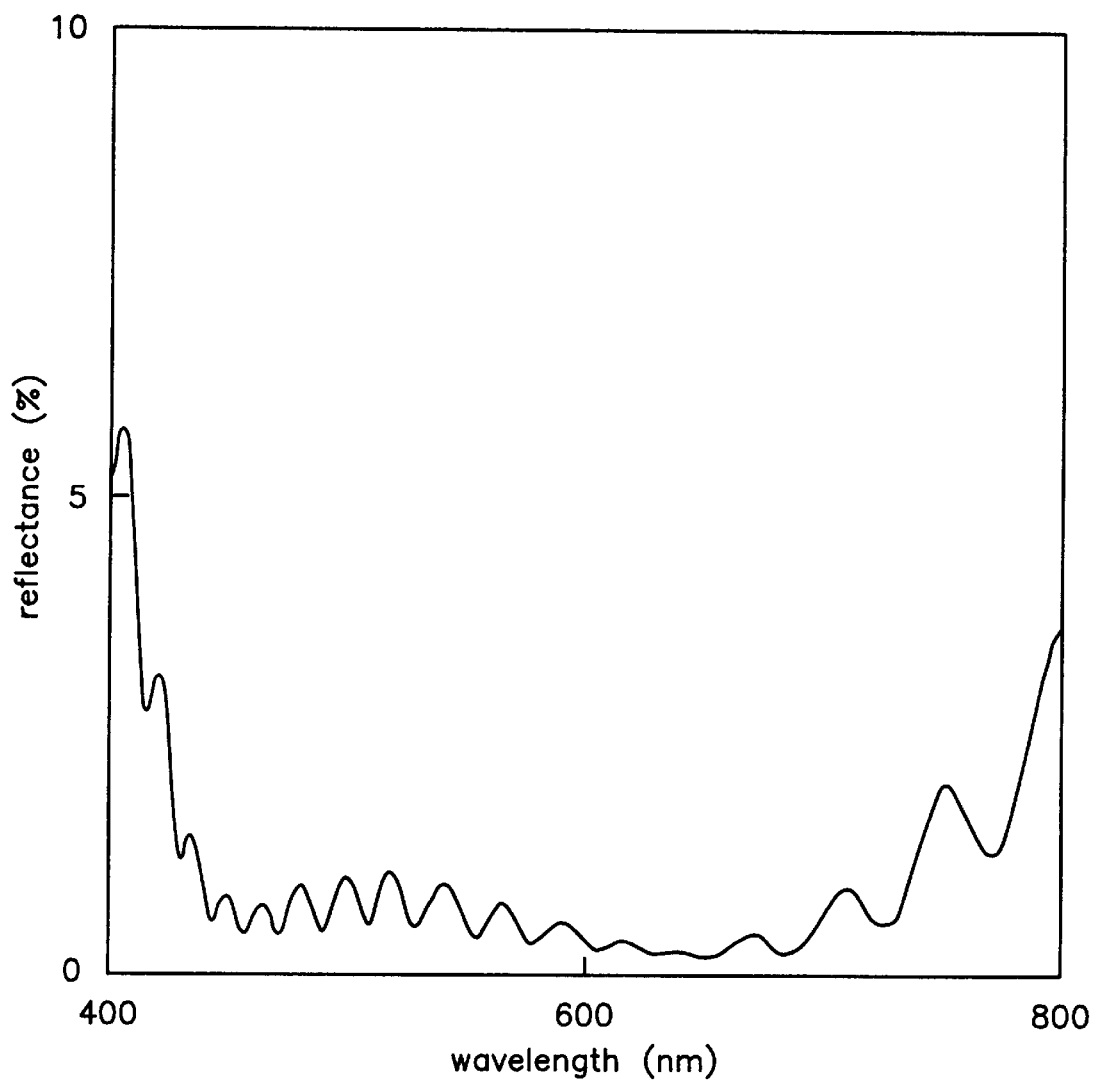
FIG. 21 A drawing showing an example of the spectral characteristic of an antireflection filter in Comparative Example 3 of a conventional method for manufacturing substrate with a thin film.
Figure 22:
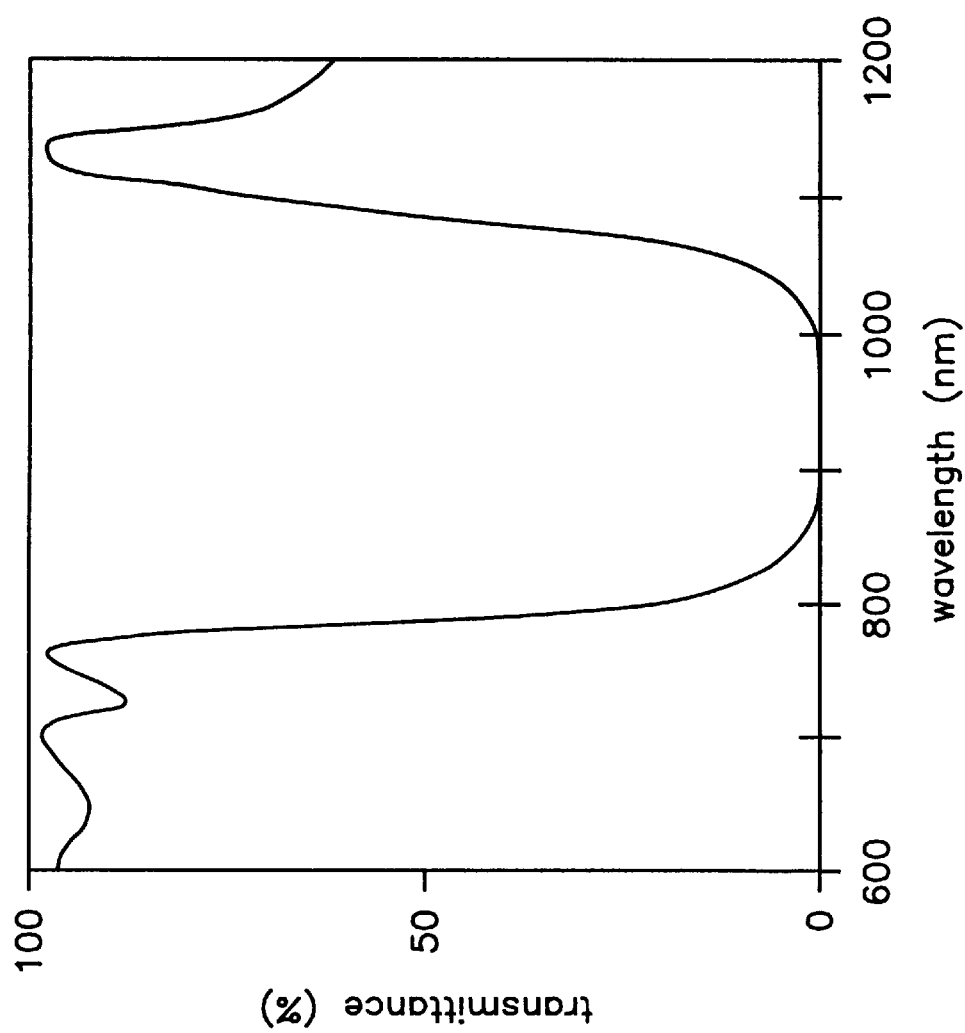
FIG. 22 A drawing showing an example of the spectral transmittance characteristic of a near infrared reflection mirror in Example 4 of the method for manufacturing substrate with a thin film of the present invention.
Figure 23:
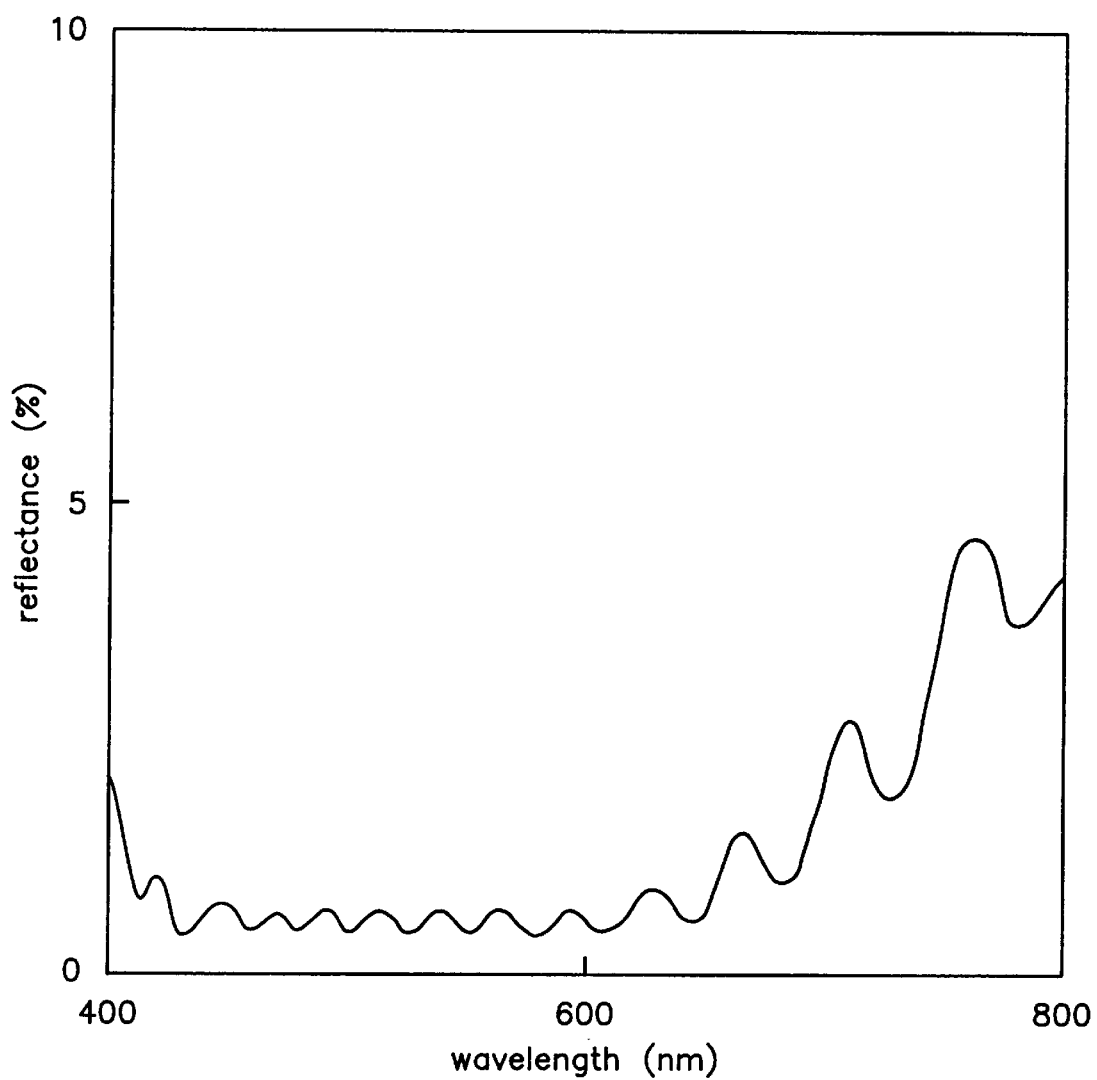
FIG. 23 A drawing showing an example of the spectral characteristic of an antireflection filter in Example 5 of the method for manufacturing substrate with a thin film of the present invention.

Films were formed as described in Comparative Example 1, except that three substrates on which a film to be formed (380 mm×460 mm×2 mm) for surface antireflection filters of displays of 20 inches (51 cm) different in size from those used in Comparative Example 1 were used to fill the available area to the maximum possible extent. The size of the domed substrate holder (1200 mm in diameter) remained the same. The state is shown in FIG. 15.

Since the substrate holder was the same, the process and tact cycle time were the same.

This tact cycle of operation was repeated 235 times, and the time taken for the operation including initial evacuation and final unloading was 72 hours (3 days). In this operation, 705 surface antireflection filters (3 substrates ×235 times) of displays of 20 inches (51 cm) were produced.

The productivity of Example 3 was as high as about 8 times that of Comparative Example 3 (5,600 films/705 films $a$ 8 times).

EXAMPLE 4

The film forming apparatus shown in FIG. 1 was used to form a thin film on each of substrates on which a film to be formed, for manufacturing substrate with a thin film. The substrate with a thin film were intended to be used as near infrared reflection mirrors, and the thin films were optical thin films requiring strict film thickness control.

The film forming process was vacuum evaporation or ion assisted evaporation. The substrates on which a film to be formed were made of a transparent plastic material. The film forming area had a width of 1200 mm. The installation area of the apparatus was about 100 m$^2$ and two operators were necessary for operating the apparatus.

The film formation monitor was placed outside the film forming area to eliminate the influence on the substrate size.

The distance between the film formation monitor and the film forming particle generation source was longer than the shortest distance between the film forming area and the generation source and shorter than the longest distance, and the direction normal to the film formation monitor agreed with the direction in which the film forming particles flew at the position of the film formation monitor. The thickness of the film formed on the film formation monitor was measured using both a light interference type optical film thickness meter and a quartz type film thickness meter.

The film composition was as shown in Table 3. The film forming process is described below.

One transparent substrate PMMA (450 mm×1150 mm×2 mm) for a near infrared reflection mirror hard-coated on both sides with an ultraviolet setting acrylic resin was set on one holder of substrate on which a film to be formed (500 mm×1200 mm). Twenty substrate holders of this type were prepared to hold 20 substrates in total. The substrates were heated to 80° C. by micro heaters and halogen lamps.

(0) As pretreatment, a plasma generation type ion gun (Model RIS ion gun produced by Shincron K. K.) of the film forming chamber was used to accelerate oxygen ions at an accelerating voltage of 500 V at an accelerating current of 100 mA, for irradiating the area where the substrates on which a film to be formed were fed through, while the twenty substrates on which a film to be formed were fed at a rate of 3 m/min for exposure to the oxygen ions. Until the feeding of all the twenty substrates on which a film to be formed was completed, it took 4 minutes.

(1) SiO$_2$ for the first layer was heated (degassed) for 2 minutes, to let the temperature of the SiO$_2$ particle generating region reach a steady state, and the shutter was opened. The stability of film formation was confirmed for 30 minutes on the film formation monitor, and the twenty substrates on which a film to be formed were started to be fed, for exposure in the film formation area. The energy of the electron gun to the film forming particle generation source was controlled by monitoring the deposition rate of the film formed on the sensor of a quartz type film thickness meter, and feeding back the output to keep the deposition rate constant. The speed of passage was controlled to keep the formed film thickness constant. After the feeding of all the twenty substrates on which a film to be formed was completed, the shutter was closed. The time taken until the shutter was closed was about 4 minutes.

(2) TiO$_2$ for the second layer was preliminarily heated while the first layer was vapor-deposited, and as soon as the shutter was closed in step (1), oxygen was introduced to keep the pressure of the film forming chamber at 1.0×10$^{-2}$ Pa. Then, the shutter provided above TiO$_2$ was opened, and after the stability of film formation was confirmed for 30 seconds on the film formation monitor, the twenty substrates on which a film to be formed were started to be fed, for exposure in the film forming area. The energy of the electron gun to the film forming particle generation source was controlled by monitoring the deposition rate of the film formed on the sensor of the quartz type film thickness meter and feeding back the output to keep the deposition rate constant. The speed of passage was controlled to keep the formed film thickness constant. After the feeding of all the twenty substrates on which a film to be formed was completed, the shutter was closed. The time taken until the shutter was closed was about 4 minutes.

(3) $SiO_2$ for the third layer was preliminarily heated while the second layer was vapor-deposited, and as soon as the shutter was closed in step (2), the shutter provided above $SiO_2$ was opened. The stability of film formation was confirmed for 30 seconds on the film formation monitor, and twenty substrates on which a film to be formed were started to be fed, for exposure in the film forming area. The film forming conditions were quite the same as those in step (1). The time taken until the shutter was closed was about 4 minutes.

(4) Steps (2) and (3) were repeated five times.

(5) $TiO_2$ for the fourteenth layer was treated as described in step (2).

(6) $SiO_2$ for the fifteenth layer was treated as described in step (3). The time taken until the shutter was closed was 2 minutes.

TABLE 2

| From substrate | Layer forming | Optical layer material thickness |
| --- | --- | --- |
| 1st layer | SiO2 | Approx.225nm |
| 2nd layer | TiO2 | Approx.225nm |
| 3rd layer | SiO2 | Approx.225nm |
| 4th layer | TiO2 | Approx.225nm |
| 5th layer | SiO2 | Approx.225nm |
| 6th layer | TiO2 | Approx.225nm |
| 7th layer | SiO2 | Approx.225nm |
| 8th layer | TiO2 | Approx.225nm |
| 9th layer | SiO2 | Approx.225nm |
| 10th layer | TiO2 | Approx.225nm |
| 11th layer | SiO2 | Approx.225nm |
| 12th layer | TiO2 | Approx.225nm |
| 13th layer | SiO2 | Approx 225nm |
| 14th layer | TiO2 | Approx.225nm |
| 15th layer | SiO2 | Approx.113nm |

EXAMPLE 5

The large-sized film forming apparatus shown in FIG. 1 was used to form a thin film on each of substrates on which a film to be formed, for manufacturing substrate with a thin film. The substrate with a thin film were intended to be used as antireflection filters of displays, and the thin films were optical thin films requiring strict film thickness control.

The film forming process was vacuum evaporation, ion assisted evaporation or high frequency ion plating, and the substrates on which a film to be formed were made of a transparent plastic material. The film forming area had a width of 1200 mm. The installation area of the apparatus was about 140 m², and two operators were necessary for operating the apparatus. Since the number of film forming chambers was one, the number of evacuation pumps could also be one, and it was not necessary to prepare many electron guns as means for generating film forming particles. So, the apparatus could be very low in cost.

The film formation monitor was arranged outside the film forming area, to eliminate the influence on the substrate size.

The distance between the film formation monitor and the film forming particle generation source was longer than the shortest distance between the film forming area and the generation source and shorter than the longest distance, and the direction normal to the film formation monitor agreed with the direction in which the film forming particles flew at the position of the film formation monitor. The thickness of the film formed on the film formation monitor was measured using both a light interference type optical film thickness meter and a quartz type film thickness meter.

The film composition was as shown in Table 1. The film forming process is described below.

One substrate PMMA (700 mm×900 mm×5 mm) for a surface antireflection filter of PDP with a diagonal line length of 42 inches (107 cm), hard-coated on both sides with an ultraviolet setting acrylic resin, was set on one holder of substrate on which a film to be formed (800 mm×1200 mm). The substrate was a grayish colored substrate with selective transmittability of three primary colors (red, green and blue) at a transmittance of 70%. Sixteen substrate holders of this type were prepared to hold sixteen substrates on which a film to be formed in total.

The film forming conditions were as described in Example 1, except that the feed distance per once was different and that the time taken for forming one film was different.

Examples 1 through 3 and Comparative Examples 1 through 3 were evaluated according to the following methods:

(1) Surface Abrasion Resistance

A roll of steel wool #0000 was rubbed against a sample with a load of 2 kg applied, in the directions in parallel and perpendicular to the fibers of the steel wool. The abrasion resistance was evaluated according to the following criterion:

A: Not flawed at all

B : Slightly flawed

C: A little flawed

D: Heavily flawed (2) Adhesion

A sample was cut in by a razor to form one hundred 1 mm meshes. A cellophane adhesive tape was stuck onto the portion of 100 meshes, and removed at a time. The number of meshes remaining on the sample was counted for evaluation.

(3) Wear Resistance

Gauze impregnated with a marketed glass cleaner was rubbed against a sample with a load of 2 kg applied, 2000 times, to observe the appearance such as film peeling under transmitted light.

(4) A sample was immersed in 60° C. water for 2 hours, to evaluate according to (1) through (3).

(5) Heat resistance

A sample was allowed to stand in a 80° C. drying oven for 1 hour, to observe the appearance.

(6) Surface resistance value

A tester was used to apply a probe with a width of 1 cm to the surface of a sample for measuring the electric resistance. A sample with a surface resistance of 5 k½ or less was acceptable.

(7) Spectral characteristic

A spectrophotometer (Hitachi Model 330) was used for measurement. In the case of an antireflection optical filter, a spectral characteristic in a wavelength range of 400 nm to 800 nm was measured, and in the case of a near infrared reflection filter, a spectral transmittance characteristic in a wavelength range of 600 nm to 1200 nm was measured.

The evaluation results of the examples and comparative examples are shown together in Table 2. The spectral characteristics are shown in FIGS. 16 through 23. In both the examples and the comparative examples, similar physical properties and optical properties could be obtained, and excellent antireflection optical filters could be produced.

TABLE 3

| Evaluation item | Example 1 | Comparative Example 1 | Example 2 | Comparative Example 2 | Example 3 | Comparative Example 3 |
|---|---|---|---|---|---|---|
| (1) Surface abrasion resistance | A | A | A | A | A | A |
| (2) Adhesion | 100/100 | 100/100 | 100/100 | 100/100 | 100/100 | 100/100 |
| (3) Wear resistance | ○ | ○ | ○ | ○ | ○ | ○ |
| (4) Surface abrasion resistance after hot water treatment | B | B | B | B | B | B |
| (5) Adhesion after hot water treatment | 110/100 | 100/100 | 100/100 | 100/100 | 100/100 | 100/100 |
| (6) Wear resistance after hot water treatment | ○ | ○ | ○ | ○ | ○ | ○ |
| (7) Heat resistance | ○ | ○ | ○ | ○ | ○ | ○ |
| (8) Surface resistance | ○ | ○ | ○ | ○ | ○ | ○ |

INDUSTRIAL APPLICABILITY

According to the method and apparatus for manufacturing substrate with a thin film of the present invention, even when a thin multi-layer film is formed on each of large-sized substrates on which a film to be formed, thin films and substrate with a thin film can be continuously produced using a smaller inexpensive manufacturing apparatus. Since the apparatus is small in installation space, it is effective for saving the space of the factory.

The method and apparatus for manufacturing substrate with a thin film of the present invention is very effective especially when the substrates are made of a resin, and desired films are liable to be obtained, and physical properties such as film adhesion are very good.

According to the method and apparatus for manufacturing substrate with a thin film of the present invention, the thin films obtained are less likely to be irregular in the feed direction of substrates.

According to the method and apparatus for manufacturing substrate with a thin film of the present invention, even when a thin film is formed on each of large-sized substrates on which a film to be formed, the substrates on which a film to be formed can be arranged at a high degree of freedom, to improve the productivity of the substrate with a thin film manufacturing process.

According to the method and apparatus for manufacturing substrate with a thin film of the present invention, since the film formed in the film formation monitor has properties close to those of the thin film formed on each of substrates on which a film to be formed, the film thickness can be accurately controlled.

According to the method and apparatus for manufacturing substrate with a thin film of the present invention, since the film forming process is controlled based on the film forming rate of the film formed on the film formation monitor, the physical properties of the thin films produced can be accurately controlled.

I claim:

1. A method for manufacturing a substrate with a thin film, in which a film forming chamber with, upstream and downstream of a film forming area, first and second stockers, respectively, capable of storing in multi-stages a group of substrates on which a film is to be formed is provided, and, upstream and downstream of the film forming chamber, a loading chamber and an unloading chamber are provided, respectively, with a stocker capable of storing in multi-stages the group of substrates on which a film is to be formed, wherein while the group of substrates on which a film is to be formed is being subjected to film forming in the film forming chamber, the loading chamber is loaded with the next group of substrates on which a film is to be formed, and evacuated, and the group of substrates which has been previously subjected to film forming are unloaded from the unloading chamber, wherein each substrate of the group of substrates in the film forming chamber is subjected to film forming while passing through the film forming area, and the movement of the group of substrates from chamber to chamber is conducted groupwise while keeping respective chambers within a same sealed pressure control.

2. A method for manufacturing a substrate with a thin film according to claim 1, wherein the substrates on which a film is to be formed are taken out of the first stocker one after another, passed through the film forming area one after another, placed into the second stocker one after another, taken out of the second stocker one after another, passed through the film forming area one after another, and placed into the first stocker one after another, thus being moved in the sealed chamber repetitively.

3. A method for manufacturing a substrate with a thin film according to claim 2, wherein after a film has been formed once, the material of the film forming particle generation source is changed while the film forming chamber is kept reduced in pressure, and the substrates on which a film is to be formed are passed through again through the film forming area, to form a film of two or more layers.

4. A method for manufacturing a substrate with a thin film according to claim 1, wherein the speed of passage is substantially constant.

5. A method for manufacturing a substrate with a thin film according to claim 1, wherein two or more film forming particle generating materials are provided in the film forming chamber, and the substrates are moved from the first stocker to the second stocker, to form a film of two or more layers by one time of passing.

6. A method for manufacturing a substrate with a thin film according to claim 1, wherein a second loading chamber is provided upstream of the loading chamber and is loaded with the group of substrates on which a film is to be formed that is to be fed after the next group, and evacuated, while a group of substrates on which a film is to be formed is being subjected to film forming in the film forming chamber.

7. A method for manufacturing a substrate with a thin film according to claim 1, wherein a second unloading chamber is provided downstream of the unloading chamber so that the substrate on which a film is to be formed which has been subjected to film forming in the previous step is relocated from the unloading chamber to the second unloading chamber, and that the substrate on which a film is to be formed which has been subjected to film forming in the step before the previous step is unloaded from the second unloading chamber while a group of substrates on which a film is to be formed is being subjected to film forming in the film forming chamber.

8. A method for manufacturing a substrate with a thin film according to claim 1, wherein the loading chamber is heated.

9. A method for manufacturing a substrate with a thin film according to claim 1, wherein said film is formed in the film forming chamber while a film forming process is controlled based on a thickness of the film formed on a film formation monitor.

10. A method for manufacturing a substrate with a thin film according to claim 9, wherein the thin film forming process is controlled by changing temperature of the substrate on which a film is to be formed, degree of vacuum, length of film forming area, speed of passage of the substrate on which a film is to be formed, or density of film forming particles, or a combination thereof during film formation.

11. A method for manufacturing a substrate with a thin film according to claim 10, wherein the film is forming process is controlled by changing the temperature of the substrate on which a film to be formed.

12. A method for manufacturing a substrate with a thin film according to claim 10, wherein the film forming process is controlled by changing the degree of vacuum.

13. A method for manufacturing a substrate with a thin film according to claim 10, wherein the film forming process is controlled by changing the length of the film forming area.

14. A method for manufacturing a substrate with a thin film according to claim 10, wherein the film forming process is controlled by changing the speed of passage of the substrate on which a film is to be formed.

15. A method for manufacturing a substrate with a thin film according to claim 10, wherein the film forming process is controlled by changing the density of the film forming particles.

16. A method for manufacturing a substrate with a thin film according to claim 9, wherein the film formation monitor is arranged within the film forming area but outside a region in which the substrate is located.

17. A method for manufacturing a substrate with a thin film according to claim 9, wherein a film forming area limiting member is provided in the film forming chamber, and the film formation monitor is arranged between the film forming area limiting member and the film forming particle generation source.

18. A method for manufacturing a substrate with a thin film according to claim 9, wherein the film formation monitor is moved in the film forming area during film formation.

19. A method for manufacturing a substrate with a thin film according to claim 9, wherein a film forming rate is measured based on the thickness of the film formed on the film formation monitor, and the film forming process is controlled based on the film forming rate.

20. A method for manufacturing a substrate with a thin film according to claim 9, wherein said film is formed to keep the film forming rate constant.

21. A method for manufacturing a substrate with a thin film according to claim 9, wherein a method for detecting the thickness of the film formed on the film forming monitor is the light interference method.

22. A method for manufacturing a substrate with a thin film according to claim 1, wherein the film forming method is vacuum evaporation, ion assisted evaporation, ion plating or sputtering.

23. A method for manufacturing a substrate with a thin film according to claim 1, wherein during film formation, a film forming particle generating material is continuously supplied to a film forming particle generating region.

24. A method for manufacturing substrate a with a thin film according to claim 1, wherein the substrate with a thin film is surface antireflection filter substrate for displays.

25. A method for manufacturing a substrate with a thin film according to claim 1, wherein the substrate with a thin film is color filter substrate for liquid crystal display.

26. A method for manufacturing a substrate with a thin film according to claim 1, wherein the substrate with a thin film is a substrate for transparent electrodes.

27. A method for manufacturing a substrate with a thin film according to claim 1, wherein the substrate with a thin film is a front panel of plasma display panels (PDP).

28. A method for manufacturing a substrate with a thin film according to claim 1, wherein the substrate with a thin film is MgO substrate on which the film is to be formed is used in plasma display panels (PDP).

29. A method for manufacturing a substrate with a thin film according to claim 1, wherein the substrate with a thin film is a band pass filter substrate.

30. A method for manufacturing a substrate with a thin film according to claim 1, wherein the substrate with a thin film is an optical lens.

31. An apparatus for manufacturing a substrate with a thin film, comprising a film forming chamber with, upstream and downstream of a film forming area, first and second stockers capable of storing in multi-stages a group of substrates on which a film is to be formed and, upstream and downstream of said film forming chamber, a loading chamber and an unloading chamber, respectively with a stocker capable of storing in multi-stages a group of substrates on which a film is to be formed, wherein said film forming chamber, said loading chamber and said unloading chamber have respectively an evacuation means capable of evacuating independently; and said film forming chamber has a film forming particle generation source, a means for passing the substrate on which a film is to be formed through the film forming area, and means for taking out the substrate on which a film is to be formed one after another from the first stocker into the passing means and further passing said substrate from the passing means into the second stocker.

32. An apparatus for manufacturing a substrate with a thin film according to claim 31, wherein the film forming chamber has means for taking out the substrate on which a film is to be formed one after another from the second stocker to the passing means and passing said substrate from the passing means into the first stocker.

33. An apparatus for manufacturing a substrate with a thin film according to claim 31, wherein the multi-stage stockers have a structure in which the plurality of stages are provided perpendicularly to the direction in which the substrate on which a film is to be formed is passed through the film forming area, and to and from which the substrate on which a film is to be formed is relocated in the same direction as the direction in which the substrate on which a film is to be formed is passed through the film forming area.

34. An apparatus for manufacturing a substrate with a thin film according to claim 31, wherein a means for changing the film forming particle generation source while the film forming chamber is kept reduced in pressure, is provided.

35. An apparatus for manufacturing a substrate with a thin film according to claim 31, wherein the film forming particle generation source is a cathode.

36. An apparatus for manufacturing a substrate with a thin film according to claim 31, wherein the film forming particle generation means is an electron gun.

37. An apparatus for manufacturing a substrate with a thin film according to claim 31, wherein a film formation monitor is provided within the film forming area but outside the region in which the substrate is located.

38. An apparatus for manufacturing a substrate with a thin film according to claim 31, wherein a film formation monitor capable of moving into the film forming area is provided.

39. An apparatus for manufacturing a substrate with a thin film according to claim 31, wherein an optical film thickness meter using light interference is used as a film formation monitor.

40. An apparatus for manufacturing substrate with a thin film according to claim 31, wherein the distance between the substrate on which a film is to be formed and the film forming particle generation source are 800 mm or more.

41. An apparatus for manufacturing a substrate with a thin film according to claim 31, wherein a second loading chamber capable of being evacuated independently and with a stocker capable of storing in multi-stages substrates on which a film is to be formed is provided additionally upstream of the loading chamber.

42. An apparatus for manufacturing a substrate with a thin film according to claim 31, wherein a second unloading chamber capable of being evacuated independently and with a stocker capable of storing in multi-stages substrates on which a film is to be formed is provided additionally downstream of the unloading chamber.

43. An apparatus for manufacturing a substrate with a thin film according to claim 31, wherein the loading chamber has a heating means.

44. An apparatus for manufacturing a substrate with a thin film according to claim 31, wherein the film forming chamber contains a film forming area limiting member between the film forming particle generation means and the plane where the substrate on which a film is to be formed is passed through.

45. An apparatus for manufacturing a substrate with a thin film according to claim 31, wherein during film formation, the film forming area limiting member can be moved.

46. An apparatus for manufacturing a substrate with a thin film according to claim 31, wherein two or more film forming area limiting members are provided and can be changed during film formation.

47. An apparatus for manufacturing a substrate with a thin film according to claim 31, wherein the speed of passage of the substrate on which a film is to be formed can be changed during film formation.

48. An apparatus for manufacturing a substrate with a thin film according to claim 31, wherein a means for keeping the speed at which the substrates on which a film is to be formed are passed through the area, constant during film formation, and a means for accelerating the speed of passage of the substrate on which a film is to be formed after said substrate has passed through the film forming area are provided.

49. An apparatus for manufacturing a substrate with a thin film according to claim 31, wherein the output of the rate of film forming particle generation source can be changed during film formation.

50. An apparatus for manufacturing a substrate with a thin film according to claim 31, wherein the temperature of the substrates on which a film is to be formed can be changed during film formation.

51. An apparatus for manufacturing a substrate with a thin film according to claim 31, wherein a film forming particle generating material can be continuously supplied to the film forming particle generating region during film formation.

* * * * *